United States Patent
Oh et al.

(10) Patent No.: US 10,503,266 B2
(45) Date of Patent: Dec. 10, 2019

(54) ELECTRONIC DEVICE COMPRISING ELECTROMAGNETIC INTERFERENCE SENSOR

(71) Applicant: Samsung Electronics Co., Ltd., Suwon-si, Gyeonggi-do (KR)

(72) Inventors: Young Hak Oh, Seoul (KR); Eun Seok Kim, Suwon-si (KR); Eun Jung Choi, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 93 days.

(21) Appl. No.: 15/785,869

(22) Filed: Oct. 17, 2017

(65) Prior Publication Data
US 2018/0107280 A1    Apr. 19, 2018

(30) Foreign Application Priority Data
Oct. 17, 2016 (KR) .................. 10-2016-0134250

(51) Int. Cl.
| | |
|---|---|
| *G06F 3/0346* | (2013.01) |
| *G04G 21/08* | (2010.01) |
| *G06F 3/01* | (2006.01) |
| *G01R 31/00* | (2006.01) |
| *G06F 3/0488* | (2013.01) |

(52) U.S. Cl.
CPC .......... *G06F 3/017* (2013.01); *G01R 31/001* (2013.01); *G04G 21/08* (2013.01); *G06F 3/0346* (2013.01); *G06F 3/04883* (2013.01)

(58) Field of Classification Search
CPC combination set(s) only.
See application file for complete search history.

(56) References Cited

U.S. PATENT DOCUMENTS

| | | |
|---|---|---|
| 8,665,210 B2 | 3/2014 | Tan et al. |
| 9,569,055 B2 | 2/2017 | Post et al. |
| 9,618,553 B2 | 4/2017 | Patel et al. |
| 2012/0162057 A1 | 6/2012 | Tan et al. |
| 2014/0375352 A1 | 12/2014 | Patel et al. |
| 2015/0029092 A1* | 1/2015 | Holz ............... G06F 3/017 345/156 |
| 2015/0048846 A1 | 2/2015 | Post et al. |
| 2015/0049034 A1 | 2/2015 | Post et al. |

(Continued)

FOREIGN PATENT DOCUMENTS

KR    100762967 B1    10/2007

*Primary Examiner* — Deeprose Subedi
(74) *Attorney, Agent, or Firm* — Jefferson IP Law, LLP

(57) ABSTRACT

An electronic device includes an electromagnetic interference (EMI) sensor that senses EMI patterns from an outside of the electronic device and disposed at a location touchable by a body of a user of the electronic device, a memory that stores one or more databases associated with at least a part of the EMI patterns, gestures of the user, and functions executable by the electronic device, and at least one processor electrically connected with the EMI sensor and the memory. The at least one processor is configured to sense an EMI pattern, which is changed according to a gesture among the gestures of the user, from among the EMI patterns from the body of the user using the EMI sensor, and to execute a function, which corresponds to the sensed EMI pattern based on at least a part of the one or more databases, from among the functions.

16 Claims, 15 Drawing Sheets

(56) References Cited

U.S. PATENT DOCUMENTS

| | | |
|---|---|---|
| 2015/0049055 A1 | 2/2015 | Post et al. |
| 2015/0049056 A1 | 2/2015 | Post et al. |
| 2015/0126845 A1 | 5/2015 | Jin et al. |
| 2015/0233998 A1* | 8/2015 | Chen .................... G01R 31/086 324/764.01 |
| 2015/0338651 A1 | 11/2015 | Wang et al. |
| 2016/0124500 A1* | 5/2016 | Lee ........................ G06F 3/011 345/156 |
| 2016/0216794 A1 | 7/2016 | Yoon et al. |
| 2016/0259432 A1 | 9/2016 | Bau et al. |
| 2016/0259451 A1 | 9/2016 | Bau et al. |
| 2016/0261268 A1 | 9/2016 | Rakova et al. |
| 2017/0083115 A1* | 3/2017 | Speck ..................... G06F 3/011 |
| 2018/0364902 A1* | 12/2018 | Yang ....................... G06F 1/169 |

\* cited by examiner

ELECTRONIC DEVICE COMPRISING ELECTROMAGNETIC INTERFERENCE SENSOR

CROSS-REFERENCE TO RELATED APPLICATION(S)

This application claims the benefit under 35 U.S.C. § 119(a) of a Korean patent application filed on Oct. 17, 2016 in the Korean Intellectual Property Office and assigned Serial number 10-2016-0134250, the entire disclosure of which is hereby incorporated by reference.

TECHNICAL FIELD

The present disclosure relates to a technology that controls an electronic device based on an electromagnetic interference (EMI) pattern sensed by an EMI sensor.

BACKGROUND

With the development of electronic technologies, various types of electronic products are being developed and distributed. In recent years, a wearable device, which is capable of being worn on a user, such as a smart watch, a smart glass, a head-mounted device, or the like has been increasingly distributed together with an electronic device such as a smartphone, a tablet personal computer (PC), or the like.

In the meantime, a technology that recognizes a gesture of the user by using the electronic device is being distributed. Generally, the electronic device may capture the user by using a camera included in the electronic device and may recognize the gesture of the user by analyzing the captured image.

The above information is presented as background information only to assist with an understanding of the present disclosure. No determination has been made, and no assertion is made, as to whether any of the above might be applicable as prior art with regard to the present disclosure.

SUMMARY

If a gesture of a user is recognized by using a camera, there is a lot of throughput required for an electronic device to analyze a captured image. In addition, in the case where a body of the user is out of the angle of view of the camera or is covered by other objects, it may be impossible for the electronic device to recognize the gesture of the user by using the camera. In particular, since a head-mounted device obscures the view of the user when being worn on a head of the user, it may be more difficult for the user to take a gesture within the angle of view of the camera. Furthermore, in the case where the electronic device and the user of the electronic device are in a dark place, it may be difficult for the electronic device to recognize the gesture of the user by using the camera.

Aspects of the present disclosure are to address at least the above-mentioned problems and/or disadvantages and to provide at least the advantages described below. Accordingly, an aspect of the present disclosure is to recognize a gesture of a user based on an EMI pattern and to control an electronic device or an external device linked with the electronic device based on the recognized gesture.

In accordance with an aspect of the present disclosure, an electronic device includes an electromagnetic interference (EMI) sensor that senses EMI patterns from an outside of the electronic device and disposed at a location touchable by a body of a user of the electronic device, a memory that stores one or more databases associated with at least a part of the EMI patterns, gestures of the user, and functions executable by the electronic device, and a processor electrically connected with the EMI sensor and the memory. The processor is configured to sense an EMI pattern, which is changed according to a gesture among the gestures of the user, from among the EMI patterns from the body of the user using the EMI sensor and to execute a function, which corresponds to the sensed EMI pattern based on at least a part of the one or more databases, from among the functions.

In accordance with an aspect of the present disclosure, an electronic device includes a communication circuit that communicates with one or more external devices, an EMI sensor that senses EMI patterns from an outside of the electronic device and disposed at a location touchable by a body of a user of the electronic device, a memory that stores one or more databases associated with at least a part of the EMI patterns, the one or more external devices, gestures of the user, and functions executable by the electronic device, and a processor electrically connected with the communication circuit, the EMI sensor and the memory. The processor is configured to sense a first EMI pattern changed by an external device, which is in contact with the body of the user, from among the one or more external devices from the body of the user using the EMI sensor, recognize the contacted external device based on the first EMI pattern, to sense a second EMI pattern, which is changed according to a gesture of the user, from the body of the user using the EMI sensor, and to control the contacted external device such that a function, which corresponds to the second EMI pattern, from among the functions is executed based on at least a part of the one or more databases.

Other aspects, advantages, and salient features of the disclosure will become apparent to those skilled in the art from the following detailed description, which, taken in conjunction with the annexed drawings, discloses various embodiments of the present disclosure.

According to various embodiments of the present disclosure, throughput for recognizing a gesture of a user may be reduced by recognizing his/her the gesture based on an EMI pattern.

In addition, a gesture that a user takes at various locations may be recognized by sensing an EMI pattern by using an EMI sensor being in contact with the body of the user.

Besides, a variety of effects directly or indirectly understood through this disclosure may be provided.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
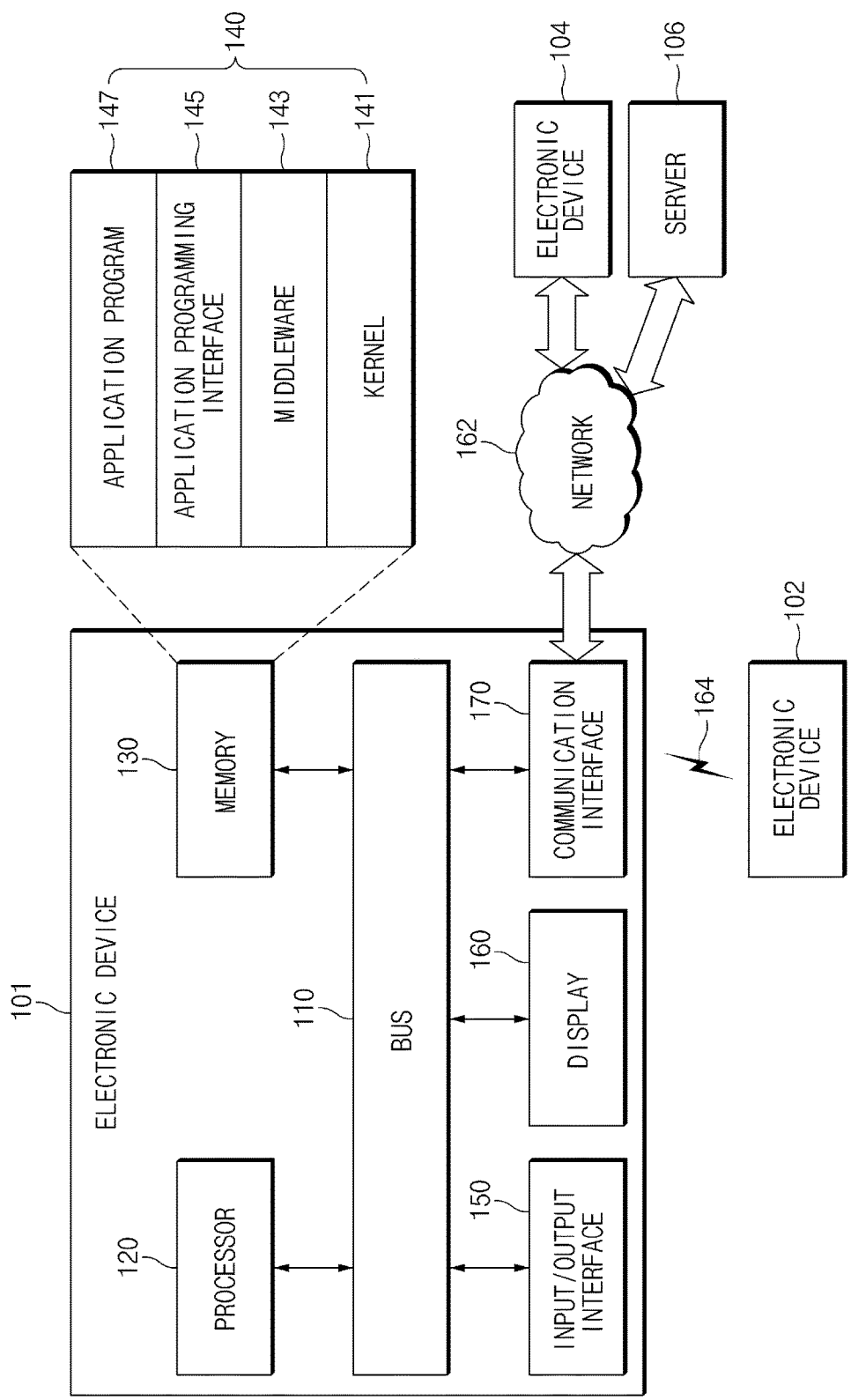
FIG. 1 illustrates an electronic device in a network environment according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled the art that the that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms of a singular form may include plural forms unless otherwise specified. In the disclosure disclosed herein, the expressions "A or B", "at least one of A or/and B", and the like used herein may include any and all combinations of one or more of the associated listed items. Expressions such as "first," or "second," and the like, may express their elements regardless of their priority or importance and may be used to distinguish one element from another element but is not limited to these components. When an (e.g., first) element is referred to as being "(operatively or communicatively) coupled with/to" or "connected to" another (e.g., second) element, it may be directly coupled with/to or connected to the other element or an intervening element (e.g., a third element) may be present.

According to the situation, the expression "configured to" used herein may be interchangeably used as, for example, the expression "suitable for", "having the capacity to", "designed to", "adapted to", "made to", or "capable of". The expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor (AP) which performs corresponding operations by executing one or more software programs which are stored in a memory device.

According to various embodiments of the present disclosure, an electronic device may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), motion picture experts group (MPEG-1 or MPEG-2) audio layer 3 (MP3) players, medical devices, cameras, or wearable devices. A wearable device may include at least one of an accessory type of a device (e.g., a timepiece, a ring, a bracelet, an anklet, a necklace, glasses, a contact lens, or a head-mounted-device (HMD)), one-piece fabric or clothes type of a circuit (e.g., electronic clothes), a body-attached type of a circuit (e.g., a skin pad or a tattoo), or a bio-implantable type of a circuit. According to an embodiment, the electronic device may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, media boxes (e.g., Samsung HomeSync™, Apple TV™, or Google TV™), game consoles (e.g., Xbox™ or PlayStation™), electronic dictionaries, electronic keys, camcorders, electronic picture frames, or the like.

According to another embodiment, the electronic devices may include at least one of medical devices (e.g., various portable medical measurement devices (e.g., a blood glucose monitoring device, a heartbeat measuring device, a blood pressure measuring device, a body temperature measuring device, and the like)), a magnetic resonance angiography (MRA), a magnetic resonance imaging (MRI), a computed tomography (CT), scanners, and ultrasonic devices), navigation devices, global navigation satellite system (GNSS), event data recorders (EDRs), flight data recorders (FDRs), vehicle infotainment devices, electronic equipment for vessels (e.g., navigation systems, gyrocompasses, and the like), avionics, security devices, head units for vehicles, industrial or home robots, drones, automatic teller's machines (ATMs), points of sales (POSs), or internet of things (e.g., light bulbs, various sensors, sprinkler devices, fire alarms, thermostats, street lamps, toasters, exercise equipment, hot water tanks, heaters, boilers, and the like). According to another embodiment, the electronic devices may include at least one of parts of furniture, buildings/structures, or vehicles, electronic boards, electronic signature receiving devices, projectors, or various measuring instruments (e.g., water meters, electricity meters, gas meters, or wave meters, and the like). According to various embodiments, an electronic device may be a flexible electronic device or may be a combination of two or more of the above-described devices. An electronic device according to an embodiment of the present disclosure may not be limited to the above-described electronic devices. The term "user" used herein may refer to a person who uses an electronic device or may refer to a device (e.g., an artificial intelligence electronic device) that uses an electronic device.

FIG. 1 illustrates an electronic device in a network environment according to an embodiment of the present disclosure.

Referring to FIG. 1, there is illustrated an electronic device 101 in a network environment 100 according to various embodiments. The electronic device 101 may include a bus 110, a processor 120, a memory 130, an input/output (I/O) interface 150, a display 160, and a communication interface 170. According to an embodiment, the electronic device 101 may not include at least one of the above-described elements or may further include other element(s). The bus 110 may interconnect the above-described elements 110 to 170 and may include a circuit for conveying communications (e.g., a control message or data) among the above-described elements. The processor 120 may include one or more of a central processing unit (CPU), an AP, or a communication processor (CP). The processor 120 may perform, for example, data processing or an operation associated with control or communication of at least one other element(s) of the electronic device 101.

The memory 130 may include a volatile and/or nonvolatile memory. For example, the memory 130 may store instructions or data associated with at least one other element(s) of the electronic device 101. According to an embodiment, the memory 130 may store software and/or a program 140. The program 140 may include, for example, a kernel 141, a middleware 143, an application programming interface (API) 145, and/or an application program (or an "application") 147. At least a part of the kernel 141, the middleware 143, or the API 145 may be called an "operating system (OS)". The kernel 141 may control or manage system resources (e.g., the bus 110, the processor 120, the memory 130, and the like) that are used to execute operations or functions of other programs (e.g., the middleware 143, the API 145, and the application program 147). Furthermore, the kernel 141 may provide an interface that allows the middleware 143, the API 145, or the application program 147 to access discrete elements of the electronic device 101 so as to control or manage system resources.

The middleware 143 may perform, for example, a mediation role such that the API 145 or the application program 147 communicates with the kernel 141 to exchange data. Furthermore, the middleware 143 may process one or more task requests received from the application program 147 according to a priority. For example, the middleware 143 may assign the priority, which makes it possible to use a system resource (e.g., the bus 110, the processor 120, the memory 130, or the like) of the electronic device 101, to at least one of the application program 147 and may process the task requests. The API 145 may be an interface through which the application program 147 controls a function provided by the kernel 141 or the middleware 143, and may include, for example, at least one interface or function (e.g., an instruction) for a file control, a window control, image processing, a character control, or the like. For example, the I/O interface 150 may transmit an instruction or data, input from a user or another external device, to other element(s) of the electronic device 101, or may output an instruction or data, input from the other element(s) of the electronic device 101, to the user or the external device.

The display 160 may include, for example, a liquid crystal display (LCD), a light-emitting diode (LED) display, an organic LED (OLED) display, or a microelectromechanical systems (MEMS) display, or an electronic paper display. The display 160 may display, for example, various kinds of content (e.g., a text, an image, a video, an icon, a symbol, or the like) to a user. The display 160 may include a touch screen and may receive, for example, a touch, gesture, proximity, or hovering input using an electronic pen or a portion of a user's body. The communication interface 170 may establish communication between the electronic device 101 and an external electronic device (e.g., a first external electronic device 102, a second external electronic device 104, or a server 106). For example, the communication interface 170 may be connected to a network 162 through wireless communication or wired communication to communicate with an external device (e.g., the second external electronic device 104 or the server 106). For example, the communication interface 170 may also be connected via a wired or wireless connection 164 to first external electronic device 102.

The wireless communication may include a cellular communication that uses at least one of, for example, a long-term evolution (LTE), an LTE Advance (LTE-A), a code division multiple access (CDMA), a wideband CDMA (WCDMA), a universal mobile telecommunications system (UMTS), a wireless broadband (WiBro), a global system for mobile communications (GSM), or the like. According to an embodiment, the local area network may include at least one of wireless fidelity (Wi-Fi), Bluetooth, Bluetooth low energy (BLE), Zigbee, near field communication (NFC), magnetic secure transmission (MST), or radio frequency (RF), or body area network (BAN). According to an embodiment, a wireless communication may include the GNSS. The GNSS may be, for example, a global positioning system (GPS), a global navigation satellite system (GLONASS), a Beidou Navigation Satellite System (hereinafter referred to as "Beidou"), or an European global satellite-based navigation system (Galileo). In this specification, "GPS" and "GNSS" may be interchangeably used. The wired communication may include at least one of, for example, a universal serial bus (USB), a high definition multimedia interface (HDMI), a recommended standard-232 (RS-232), a power line communication, a plain old telephone service (POTS), or the like. The network 162 may include at least one of a telecommunication network, for example, a computer network (e.g., LAN or WAN), an Internet, or a telephone network.

Each of the first and second external electronic devices 102 and 104 may be a device of which the type is different from or the same as that of the electronic device 101. According to various embodiments, all or a part of operations that the electronic device 101 will perform may be executed by another or plural electronic devices (e.g., the electronic devices 102 and 104 or the server 106). According to an embodiment, in the case where the electronic device 101 executes any function or service automatically or in response to a request, the electronic device 101 may not perform the function or the service internally, but, alternatively additionally, it may request at least a part of a function associated with the electronic device 701 at other device (e.g., the electronic device 102 or 104 or the server 106). The other electronic device (e.g., the electronic device 102 or 104 or the server 106) may execute the requested function or additional function and may transmit the execution result to the electronic device 101. The electronic device 101 may provide the requested function or service by processing the received result as it is, or additionally. To this end, for example, cloud computing, distributed computing, or client-server computing may be used.

Figure 2:
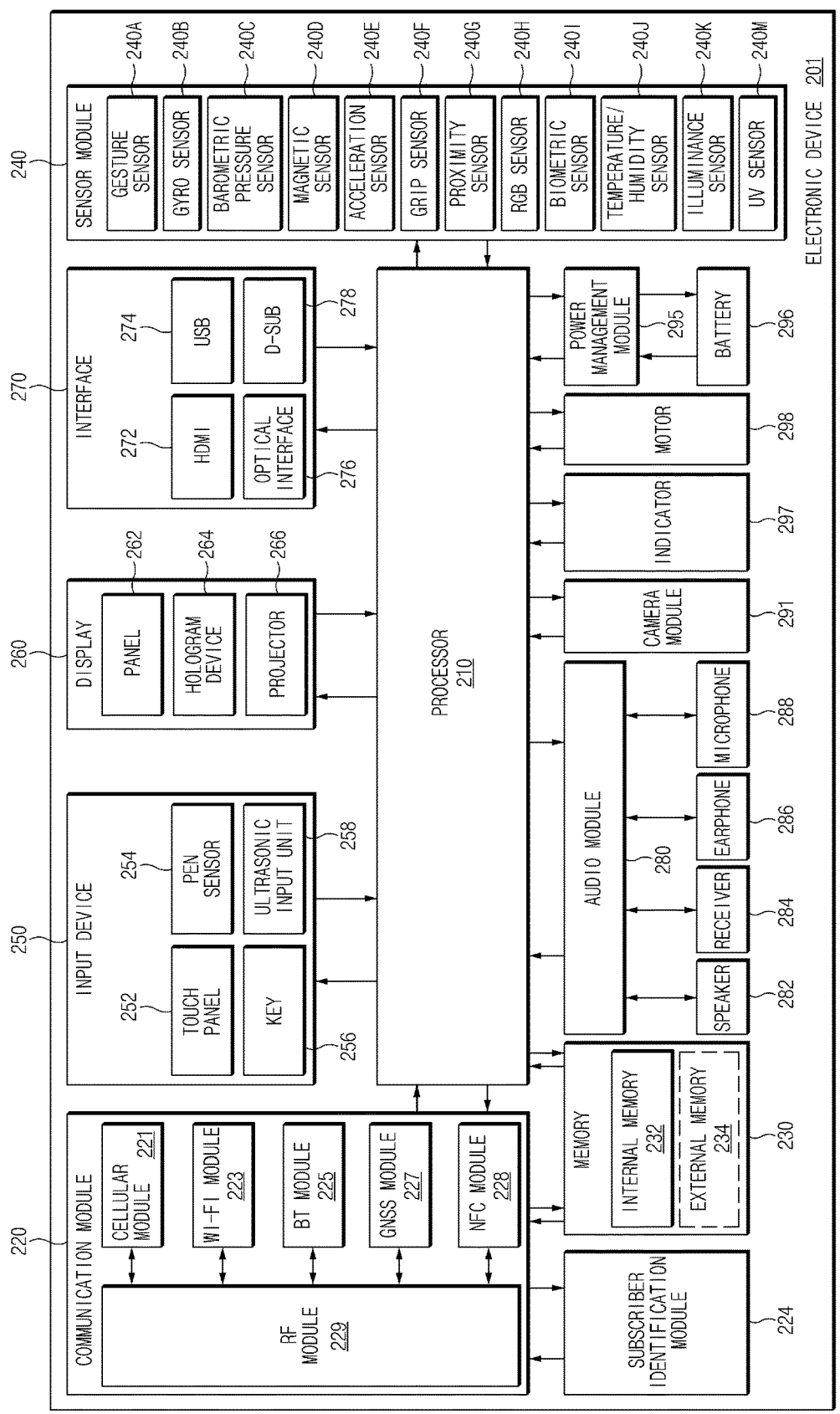
FIG. 2 illustrates a block diagram of the electronic device, according to an embodiment of the present disclosure.

FIG. 2 is a block diagram illustrating an electronic device 201 according to an embodiment of the present disclosure.

Referring to FIG. 2, an electronic device 201 may include, for example, all or a part of an electronic device 101 illustrated in FIG. 1. The electronic device 201 may include one or more processors (e.g., an AP) 210, a communication module 220, a subscriber identification module 224, a memory 230, a sensor module 240, an input device 250, a display 260, an interface 270, an audio module 280, a camera module 291, a power management module 295, a battery 296, an indicator 297, and a motor 298. The processor 210 may drive an OS or an application program to control a plurality of hardware or software elements connected to the processor 210 and may process and compute a variety of data. The processor 210 may be implemented with a system on chip (SoC), for example. According to an embodiment, the processor 210 may further include a graphic processing unit (GPU) and/or an image signal processor. The processor 210 may include at least a part (e.g., a cellular module 221) of elements illustrated in FIG. 2. The processor 210 may load and process an instruction or data, which is received from at least one of other elements (e.g., a nonvolatile memory) and may store result data in a nonvolatile memory.

The communication module 220 may be configured the same as or similar to a communication interface 170. For example, the communication module 220 may include a cellular module 221, a Wi-Fi module 223, a Bluetooth (BT) module 225, a global navigation satellite system (GNSS) module 227, a near field communication (NFC) module 228, and a radio frequency (RF) module 229. The cellular module 221 may provide voice communication, video communication, a character service, an Internet service, or the like through a communication network. According to an embodiment, the cellular module 221 may perform discrimination and authentication of the electronic device 201 within a communication network using a subscriber identification module 224 (e.g., a SIM card), for example. According to an embodiment, the cellular module 221 may perform at least a portion of functions that the processor 210 provides. According to an embodiment, the cellular module 221 may include a communication processor (CP). According to an embodiment, at least a part (e.g., two or more elements) of the cellular module 221, the Wi-Fi module 223, the BT module 225, the GPS module 227, or the NFC module 228 may be included within one integrated circuit (IC) or an IC package. The RF module 229 may transmit and receive, for example, a communication signal (e.g., an RF signal). The RF module 229 may include a transceiver, a power amplifier module (PAM), a frequency filter, a low noise amplifier (LNA), an antenna, or the like. According to various embodiments, at least one of the cellular module 221, the Wi-Fi module 223, the BT module 225, the GNSS module 227, or the NFC module 228 may transmit and receive an RF signal through a separate RF module. The subscriber identification module 224 may include, for example, a card or an embedded SIM which includes a subscriber identification module and may include unique identification information (e.g., integrated circuit card identifier (ICCID)) or subscriber information (e.g., integrated mobile subscriber identity (IMSI)).

For example, the memory 230 (e.g., the memory 130) may include an internal memory 232 or an external memory 234. For example, the internal memory 232 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory, a hard drive, or a solid state drive (SSD). The external memory 234 may include a flash drive such as compact flash (CF), secure digital (SD), micro secure digital (Micro-SD), mini secure digital (Mini-SD), extreme digital (xD), a multimedia card (MMC), a memory stick, or the like. The external memory 234 may be functionally or physically connected with the electronic device 201 through various interfaces.

The sensor module 240 may measure, for example, a physical quantity or may detect an operating state of the electronic device 201. The sensor module 240 may convert the measured or detected information to an electric signal. The sensor module 240 may include at least one of a gesture sensor 240A, a gyro sensor 240B, a barometric pressure sensor 240C, a magnetic sensor 240D, an acceleration sensor 240E, a grip sensor 240F, a proximity sensor 240G, a color sensor 240H (e.g., a red, green, blue (RGB) sensor), a living body (i.e., biometric) sensor 240I, a temperature/humidity sensor 240J, an illuminance sensor 240K, or an UV sensor 240M. Although not illustrated, additionally or generally, the sensor module 240 may further include, for example, an e-nose sensor, an electromyography sensor (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit that controls at least one or more sensors included therein. According to an embodiment, the electronic device 201 may further include a processor which is a part of the processor 210 or independent of the processor 210 and is configured to control the sensor module 240. The processor may control the sensor module 240 while the processor 210 remains at a sleep state.

The input device 250 may include, for example, a touch panel 252, a (digital) pen sensor 254, a key 256, or an ultrasonic input device 258. The touch panel 252 may use at least one of capacitive, resistive, infrared and ultrasonic detecting methods. Also, the touch panel 252 may further include a control circuit. The touch panel 252 may further include a tactile layer to provide a tactile reaction to a user. The (digital) pen sensor 254 may be, for example, a part of a touch panel or may include an additional sheet for recognition. The key 256 may include, for example, a physical button, an optical key, a keypad, and the like. The ultrasonic input device 258 may detect (or sense) an ultrasonic signal, which is generated from an input device, through a microphone (e.g., a microphone 288) and may verify data corresponding to the detected ultrasonic signal.

The display 260 (e.g., the display 160) may include a panel 262, a hologram device 264, a projector 266, and/or a control circuit that controls the panel 262, the hologram device 264, and the projector 266. The panel 262 may be implemented to be flexible, transparent or wearable, for example. The panel 262 and the touch panel 252 may be integrated into one or more modules. According to an embodiment, the panel 262 may include a pressure sensor (or a "force sensor") that is capable of measuring the intensity of pressure on the touch of the user. The pressure sensor may be integrated with the touch panel 252 or may be implemented with one or more sensors that are independent of the touch panel 252. The hologram device 264 may display a stereoscopic image in a space using a light interference phenomenon. The projector 266 may project light onto a screen so as to display an image. The screen may be arranged inside or outside the electronic device 201. The interface 270 may include, for example, a high-definition multimedia interface (HDMI) 272, a universal serial bus (USB) 274, an optical interface 276, or a D-subminiature (D-sub) 278. The interface 270 may be included, for example, in the communication interface 170 illustrated in FIG. 1. Additionally or alternatively, the interface 270 may include, for example, a mobile high definition link (MHL) interface, a SD card/MMC interface, or an infrared data association (IrDA) standard interface.

The audio module 280 may convert a sound and an electric signal in dual directions. At least a part of the audio module 280 may be included, for example, in the I/O interface 145 illustrated in FIG. 1. The audio module 280 may process, for example, sound information that is input or output through a speaker 282, a receiver 284, an earphone 286, or a microphone 288. The camera module 291 for shooting a still image or a video may include, for example, at least one image sensor (e.g., a front sensor or a rear sensor), a lens, an image signal processor (ISP), or a flash (e.g., an LED or a xenon lamp) The power management module 295 may manage, for example, power of the electronic device 201. According to an embodiment, the power management module 295 may include a power management integrated circuit (PMIC), a charger IC, or a battery or fuel gauge. The PMIC may have a wired charging method and/or a wireless charging method. The wireless charging method may include, for example, a magnetic resonance method, a magnetic induction method, or an electromagnetic method and may further include an additional circuit, for example, a coil loop, a resonant circuit, a rectifier, or the like. The battery gauge may measure, for example, a remaining capacity of the battery 296 and a voltage, current or temperature thereof while the battery is charged. The battery 296 may include, for example, a rechargeable battery and/or a solar battery.

The indicator 297 may display a specific state of the electronic device 201 or a part thereof (e.g., the processor 210), such as a booting state, a message state, a charging state, and the like. The motor 298 may convert an electrical signal into a mechanical vibration and may generate the following effects: vibration, haptic, and the like. For example, the electronic device 201 may include a mobile TV supporting device that processes media data according to the standards of digital multimedia broadcasting (DMB), digital video broadcasting (DVB), MediaFlo™, or the like. Each of the above-mentioned elements of the electronic device according to various embodiments of the present disclosure may be configured with one or more components, and the names of the elements may be changed according to the type of the electronic device. According to various embodiments, the electronic device (e.g., the electronic device 201) may exclude some elements or may further include other additional elements. Alternatively, some of the elements of the electronic device may be combined with each other so as to form one entity, so that the functions of the elements may be performed in the same manner as before the combination.

Figure 3:
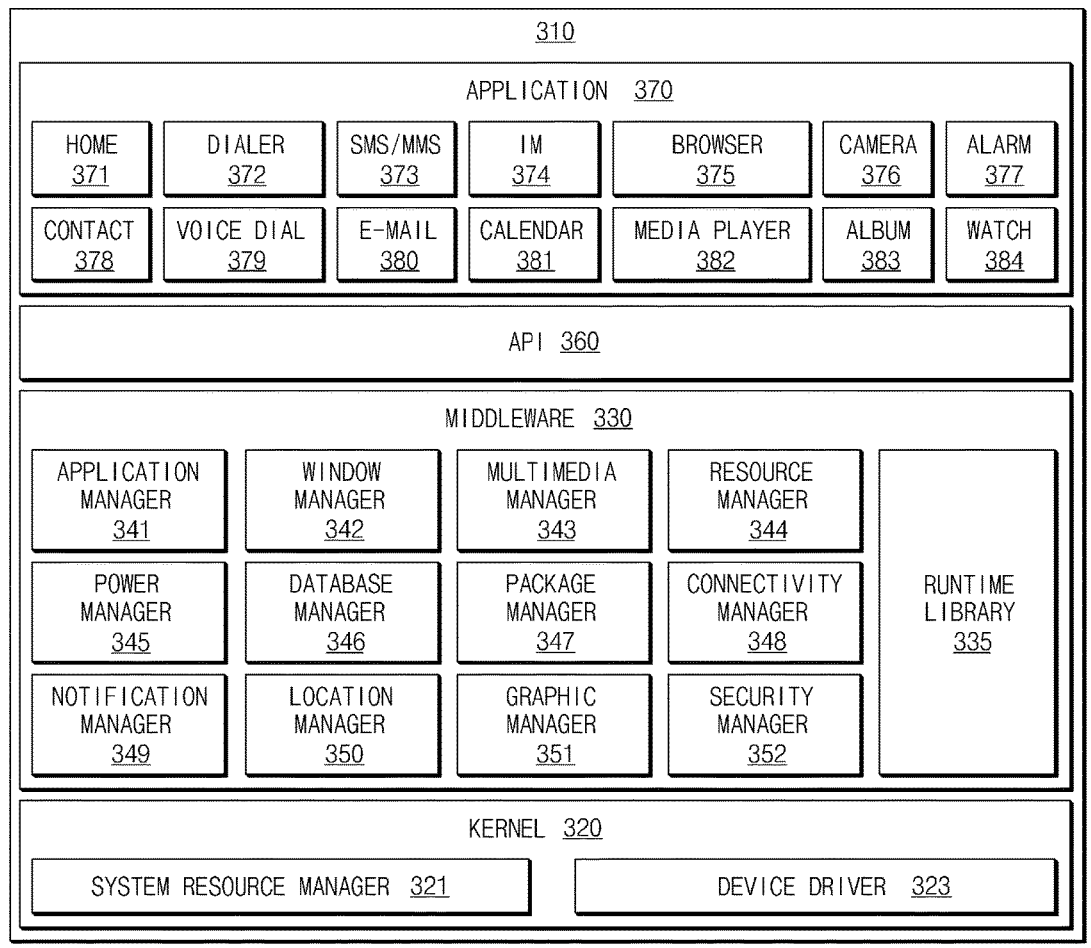
FIG. 3 illustrates a block diagram of a program module according to an embodiment of the present disclosure.

FIG. 3 is a block diagram of a program module, according to an embodiment of the present disclosure.

Referring to FIG. 3, a program module 310 (e.g., the program 140) may include an OS to control resources associated with an electronic device (e.g., the electronic device 101), and/or diverse applications (e.g., the application program 147) driven on the OS. The OS may include, for example, Android™, iOS™, Windows™, Symbian™, Tizen™, or Bada™. Referring to FIG. 3, the program module 310 may include a kernel 320 (e.g., the kernel 141), a middleware 330 (e.g., the middleware 143), an API 360 (e.g., the API 145), and/or an application 370 (e.g., the application program 147). At least a part of the program module 310 may be preloaded on an electronic device or may be downloadable from an external electronic device (e.g., the electronic device 102 or 104, the server 106, or the like).

The kernel 320 may include, for example, a system resource manager 321 and/or a device driver 323. The system resource manager 321 may perform control, allocation, or retrieval of system resources. According to an embodiment, the system resource manager 321 may include a process managing unit, a memory managing unit, or a file system managing unit. The device driver 323 may include, for example, a display driver, a camera driver, a Bluetooth driver, a common memory driver, an USB driver, a keypad driver, a Wi-Fi driver, an audio driver, or an inter-process communication (IPC) driver. The middleware 330 may provide, for example, a function which the application 370 needs in common or may provide diverse functions to the application 370 through the API 360 to allow the application 370 to use limited system resources of the electronic device. According to an embodiment, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, or a security manager 352.

The runtime library 335 may include, for example, a library module, which is used by a compiler, to add a new function through a programming language while the application 370 is being executed. The runtime library 335 may perform input/output management, memory management, or processing of arithmetic functions. The application manager 341 may manage, for example, the life cycle of the application 370. The window manager 342 may manage a GUI resource which is used in a screen. The multimedia manager 343 may identify a format necessary to play media files, and may perform encoding or decoding of media files by using a codec suitable for the format. The resource manager 344 may manage source code of the application 370 or a space of a memory. For example, the power manager 345 may manage the capacity of a battery or power and may provide power information that is needed to operate an electronic device. According to an embodiment, the power manager 345 may operate in conjunction with a basic input/output system (BIOS). For example, the database manager 346 may generate, search for, or modify a database which is to be used in the application 370. The package manager 347 may install or update an application which is distributed in the form of a package file.

The connectivity manager 348 may manage, for example, wireless connection. The notification manager 349 may provide a user with an event such as an arrival message, an appointment, or a proximity notification. The location manager 350 may manage, for example, location information of an electronic device. The graphic manager 351 may manage, for example, a graphic effect to be provided to a user or a user interface relevant thereto. The security manager 352 may provide, for example, system security or user authentication. According to an embodiment, the middleware 330 may include a telephony manager, which manages a voice or video call function of the electronic device, or a middleware module that combines functions of the above-described elements. According to an embodiment, the middleware 330 may provide a module specialized to each OS kind. The middleware 330 may remove a part of the preexisting elements, dynamically, or may add new elements thereto. The API 360 may be, for example, a set of programming functions and may be provided with another configuration which is variable depending on an OS. For example, in the case where an OS is the android or iOS™, it may be permissible to provide one API set per platform. In the case where an OS is Tizen™, it may be permissible to provide two or more API sets per platform.

The application 370 may include, for example, a home 371, a dialer 372, an short message service (SMS)/multimedia messaging service (MMS) 373, an instant message (IM) 374, a browser 375, a camera 376, an alarm 377, a contact 378, a voice dial 379, an e-mail 380, a calendar 381, a media player 382, an album 383, a watch 384, health care (e.g., measuring an exercise quantity, blood sugar, or the like), or an application for offering environment information (e.g., atmospheric pressure, humidity, or temperature). According to an embodiment, the application 370 may include an information exchanging application that supports information exchange between an electronic device and an external electronic device. The information exchanging application may include, for example, a notification relay application for transmitting specific information to the external electronic device, or a device management application for managing the external electronic device. For example, the notification relay application may send notification information, which is generated from other applications of an electronic device, to an external electronic device or may receive the notification information from the external electronic device and may provide a user with the notification information. The device management application may install, delete, or update, for example, a function (e.g., turn-on/turn-off of an external electronic device itself (or a part of components) or adjustment of brightness (or resolution) of a display) of the external electronic device, which communicates with an electronic device, or an application running in the external electronic device. According to an embodiment, the application 370 may include an application (e.g., a health care application of a mobile medical device) that is assigned in accordance with an attribute of the external electronic device. According to an embodiment, the application 370 may include an application received from an external electronic device. At least a part of the program module 310 may be implemented (e.g., performed) by software, firmware, hardware (e.g., the processor 210), or a combination of two or more thereof, and may include modules, programs, routines, sets of instructions, or processes for performing one or more functions.

Figure 4:
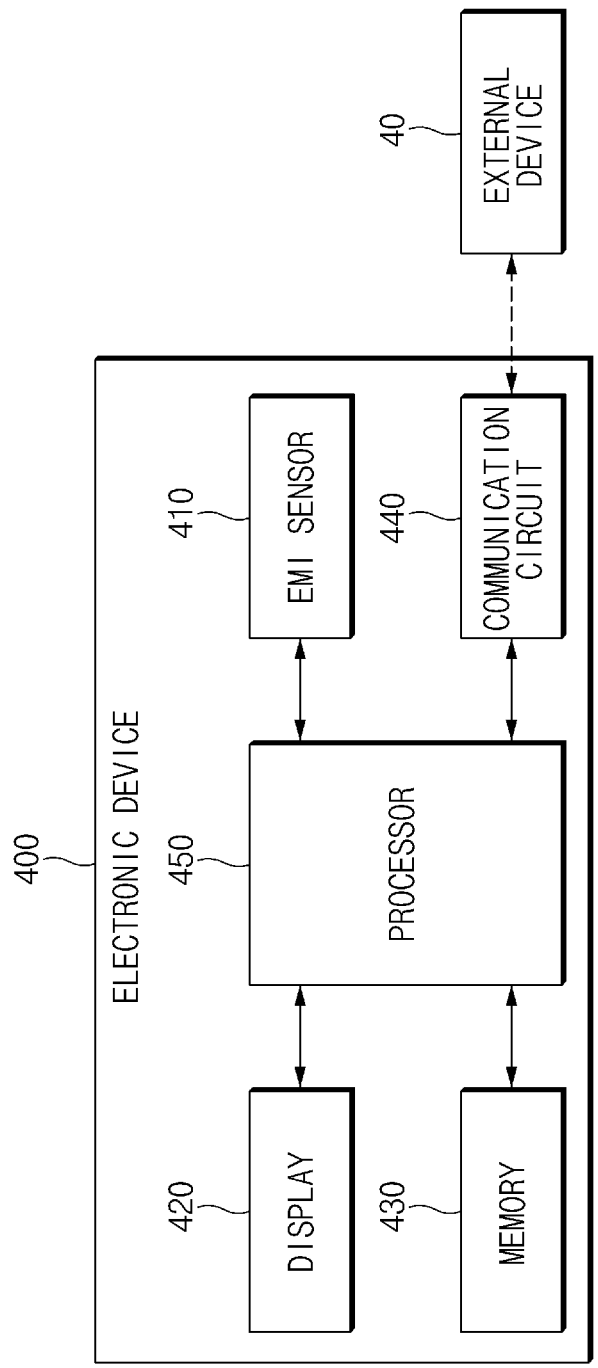
FIG. 4 is a block diagram illustrating a configuration of an electronic device, according to an embodiment of the present disclosure.

FIG. 4 is a block diagram illustrating a configuration of an electronic device, according to an embodiment of the present disclosure.

Referring to FIG. 4, an electronic device 400 according to an embodiment may include an electromagnetic interference (EMI) sensor 410, a display 420, a memory 430, a communication circuit 440, and a processor 450. For example, the electronic device 400 may be a mobile device such as a smartphone, a tablet PC, or the like. For another example, the electronic device 400 may be a wearable device such as a head-mounted device, a smart glass, a smart watch, or the like. For another example, the electronic device 400 may be a mobile device that is capable of being coupled to the head-mounted device.

The EMI sensor 410 may sense EMI patterns from the outside of the electronic device 400. The EMI sensor 410 may be disposed at a location touchable by a body of a user of the electronic device 400. For example, in the case where the electronic device 400 is a mobile device such as a smartphone, a tablet PC, or the like, the EMI sensor 410 may be disposed at a location that is touchable by a hand of the user when the user grips the electronic device 400. For another example, in the case where the electronic device 400 is a wearable device (e.g., a smart watch), the EMI sensor 410 may be disposed at a location (e.g., a rear surface of the body of a smart watch) that is touchable by his/her body if the electronic device 400 is worn on the user. In the case where the EMI sensor 410 is in contact with the body of the user, the EMI sensor 410 may sense an EMI pattern from the body of the user.

The display 420 may output various images and/or user interfaces. For example, the display 420 may display a pointer. The electronic device 400 is illustrated in FIG. 4 as including the display 420. However, since the display 420 is an optional element, the display 420 may not be included depending on implementation of the electronic device 400 according to an embodiment.

The memory 430 may store data. For example, the memory 430 may be the nonvolatile memory 430. The memory 430 may store one or more databases associated with at least a part of EMI patterns, external devices 40, gestures of the user, and functions that the electronic device 400 executes. For example, the memory 430 may store a database in which an EMI pattern is mapped to a gesture of the user, may store a database in which an EMI pattern is mapped to the external device 40, and may store a database in which the gesture of the user is mapped to a function.

According to an embodiment, the memory 430 may store a first database associated with a part of gestures of the user and a second database associated with another part of the gestures of the user. For example, the first database may include information associated with a two dimensional gesture of the user (hereinafter for convenience of description referred to as a "2D gesture"), which is recognized in a touch panel, such as tap, double tap, long press, swiping (e.g., "swiping to left", "swiping to right", "swiping to down", and "swiping to up"), "drag and drop", "pinch zoom in", and/or "pinch zoom out". The first database may include information associated with various 2D gestures in addition to the above-described gesture. For example, the second database may include information associated with a three dimensional gesture of the user (hereinafter for convenience of description referred to as a "3D gesture"), which moves in a 3-dimensional space, such as "move forward & return", "move forward & hold", "move to left", "move to right", "move downwards", "move upwards", "from grasp to spread", "extend the space between two hands", "from spread to grasp", and/or "narrow the space between two hands". The second database may include information associated with various 3D gestures in addition to the above-described gesture.

The communication circuit 440 may communicate with the external device 40. For example, the communication circuit 440 may communicate with the external device 40 in the wireless communication manner such as long term evolution (LTE), Wi-Fi, Wi-Fi Direct, Bluetooth, Bluetooth low energy (BLE), and/or Zigbee.

The processor 450 may be electrically connected with the EMI sensor 410, the display 420, the memory 430, and the communication circuit 440.

According to an embodiment, the electronic device 400 may sense an EMI pattern and may execute various functions based on the sensed EMI pattern.

According to an embodiment, the processor 450 may sense an EMI pattern, which is changed according to the gesture of the user, from the body of the user by using the EMI sensor 410. The EMI pattern may be generated from the body of the user. In the case where the body of the user moves, the EMI pattern may be changed. The EMI pattern may be differently changed according to how the body of the user moves. For example, the EMI pattern may be differently changed according to the case where a hand of the user moves from right to left or moves from left to right. The processor 450 may sense the EMI pattern, which is generated from the user, by using the EMI sensor 410 being in contact with the body of the user. In this case, different EMI patterns may be sensed depending on the gesture of the user.

According to an embodiment, the processor 450 may execute a function corresponding to the sensed EMI pattern based on at least a part of one or more databases stored in the memory 430.

For example, the processor 450 may recognize the gesture of the user corresponding to the sensed EMI pattern based on the at least a part of one or more databases. The processor 450 may compare the sensed EMI pattern with an EMI pattern stored in a database. In the case where the sensed EMI pattern is the same as an EMI pattern stored in the memory 430 (or in the case where the sensed EMI pattern is similar to the EMI pattern stored in the memory 430), the processor 450 may recognize a gesture, which is mapped to the EMI pattern stored in the memory 430, as the gesture of the user. For another example, the processor 450 may estimate a type of a gesture based on classification of the sensed EMI pattern. The processor 450 may execute a function corresponding to the gesture of the user based on the at least a part of one or more databases. If the gesture of the user is recognized, the processor 450 may verify a function, which is mapped to the gesture, from a database stored in the memory 430. The processor 450 may execute the function mapped to the gesture. The function executed depending on the gesture will be described with reference to FIG. 9.

According to an embodiment, the processor 450 may execute a function corresponding to the sensed EMI pattern based on the database stored in the external device 40 rather than the memory 430. In this case, the external device 40 may be a server that stores a database, and the processor 450 may obtain the database stored in the external device 40 by using the communication circuit 440.

According to an embodiment, the processor 450 may recognize the gesture of the user corresponding to the sensed EMI pattern based on a first database and may execute a function corresponding to the gesture of the user based on the first database. For example, the processor 450 may preferentially determine whether the gesture of the user corresponds to the 2D gesture. In the case where the gesture of the user corresponds to the 2D gesture, the processor 450 may recognize the gesture of the user by using the first database in which information associated with the 2D gesture is stored, and may execute the function corresponding to the gesture.

According to an embodiment, in the case where the gesture of the user is not recognized based on the first database, the processor 450 may recognize the gesture of the user corresponding to the sensed EMI pattern based on a second database and may execute a function corresponding to the gesture of the user based on the second database. For example, in the case where the gesture of the user does not correspond to the 2D gesture, the processor 450 may secondarily determine whether the gesture of the user corresponds to the 3D gesture. In the case where the gesture of the user corresponds to the 3D gesture, the processor 450 may recognize the gesture of the user by using the second database in which information associated with the 3D gesture is stored, and may execute the function corresponding to the gesture. As described above, throughput for recognizing a gesture may be reduced by preferentially recognizing the 2D gesture.

According to an embodiment of the present disclosure, the electronic device 400 may sense the EMI pattern, may recognize the external device 40, which is to be controlled, based on the sensed EMI pattern and may control the recognized external device 40 such that various functions are executed by the recognized external device 40. In this case, the electronic device 400 may operate in conjunction with one or more external devices 40 through the communication circuit 440. For example, the external device 40 may be a home appliance such as a speaker, a TV, a refrigerator, or the like or may be an Internet of things (IoT) device such as a LED bulb, a smart outlet, or the like.

According to an embodiment, the processor 450 may sense a first EMI pattern, which is changed by the external device 40 being in contact with the body of the user, from the body of the user by using the EMI sensor 410. The EMI pattern may be generated from the external device 40. In the case where the body of the user is in contact with (or adjacent to) the external device 40, the EMI pattern sensed from the body of the user may be changed. The EMI pattern may be differently changed according to a type of the external device 40. For example, the EMI pattern in the case where the external device 40 is a speaker may be different from the EMI pattern in the case where the external device 40 is a LED bulb. The processor 450 may sense a first EMI pattern by using the EMI sensor 410 being in contact with the body of the user. In this case, different EMI patterns may be sensed depending on the external device 40 being in contact with the user.

According to an embodiment, the processor 450 may recognize the contacted external device 40 based on the first EMI pattern. For example, the processor 450 may compare the first EMI pattern with an EMI pattern stored in the memory 430. In the case where the first EMI pattern is the same as (or similar to) the EMI pattern stored in the memory 430, the processor 450 may recognize the external device 40, which is mapped to the EMI pattern stored in the memory 430, as the external device 40 being in contact with the body of the user.

According to an embodiment, if the contacted external device 40 is recognized, the processor 450 may extract data associated with the contacted external device 40 from one or more databases. For example, the processor 450 may extract data associated with a function, which is executable by the contacted external device 40, and an EMI pattern mapped to the function from the database stored in the memory 430.

According to an embodiment, the processor 450 may sense a second EMI pattern, which is changed according to the gesture of the user, from the body of the user by using the EMI sensor 410. For example, the processor 450 may sense the second EMI pattern by using the EMI sensor 410 being in contact with the body of the user. In this case, the second EMI pattern is changed according to the gesture of the user may be sensed.

According to an embodiment, the processor 450 may control the contacted external device 40 such that a function corresponding to the second EMI pattern is executed based on at least a part of one or more databases stored in the memory 430.

For example, the processor 450 may recognize the gesture of the user corresponding to the second EMI pattern based on the at least a part of one or more databases. The processor 450 may compare the second EMI pattern with an EMI pattern stored in a database. In the case where the second EMI pattern is the same as (or similar to) an EMI pattern stored in the memory 430, the processor 450 may recognize a gesture, which is mapped to the EMI pattern stored in the memory 430, as the gesture of the user. The processor 450 may control the external device 40 such that a function corresponding to the gesture of the user is executed based on the at least a part one or more databases. If the gesture of the user is recognized, the processor 450 may verify a function, which is mapped to the gesture, from a database stored in the memory 430. The processor 450 may control the external device 40 by using the communication circuit 440 such that a function mapped to the gesture is executed. A function executed depending on the gesture will be described with reference to FIGS. 10 to 12 in detail.

According to an embodiment, the processor 450 may recognize the gesture of the user corresponding to the second EMI pattern based on the first database and may execute a function corresponding to the gesture of the user based on the first database. According to an embodiment, in the case where the gesture of the user is not recognized by using the first database, the processor 450 may recognize the gesture of the user corresponding to the second EMI pattern based on the second database and may execute the function corresponding to the gesture of the user based on the second database.

Figure 5:
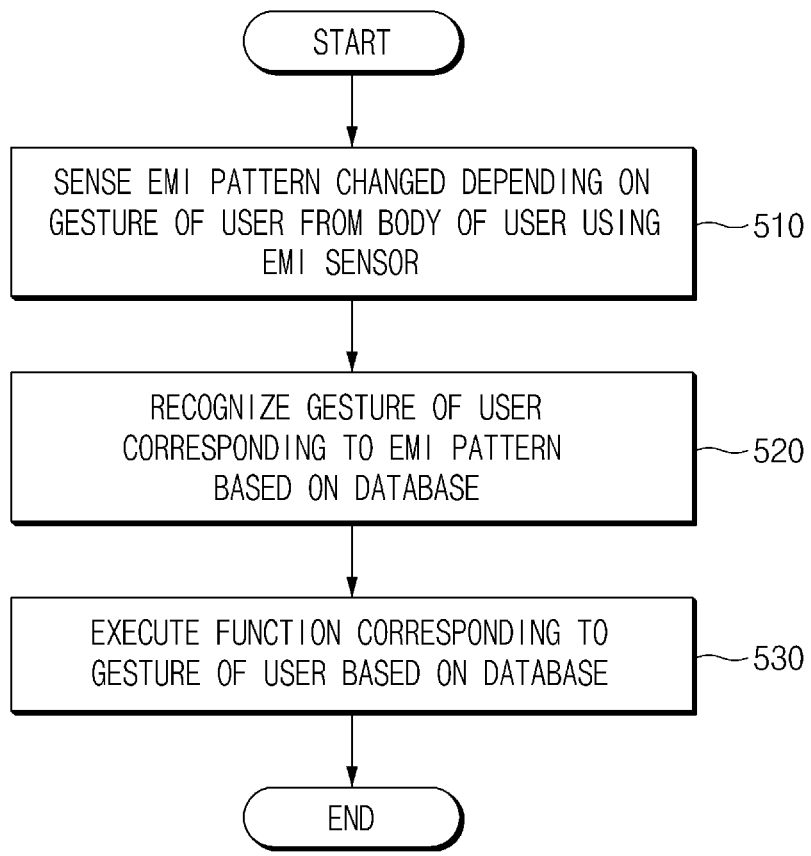
FIG. 5 is a flowchart for describing a control method based on an electromagnetic interference (EMI) pattern of an electronic device, according to an embodiment of the present disclosure.

FIG. 5 is a flowchart for describing a control method based on an EMI pattern of an electronic device, according to an embodiment of the present disclosure.

Hereinafter, it is assumed that the electronic device 400 of FIG. 4 performs a process of FIG. 5. In addition, as described in FIG. 6, it is understood that the operation described as being executed by an electronic device is controlled by the processor 450 of the electronic device 400.

Referring to FIG. 5, in operation 510, the electronic device may sense an EMI pattern, which is changed according to a gesture of a user, from the body of the user by using an EMI sensor. For example, in the case where the user moves, the EMI pattern sensed from the body of the user may be changed. The electronic device may sense the change in the EMI pattern from the body of the user by using the EMI sensor being in contact with (or adjacent to) the body of the user.

In operation 520, the electronic device may recognize a gesture of the user corresponding to the EMI pattern based on a database. For example, the electronic device may compare the sensed EMI pattern with an EMI pattern stored in the database. If the stored EMI pattern that is the same as (or similar enough to) the sensed EMI pattern is found, the electronic device may obtain information about the gesture of the user corresponding to the stored EMI pattern from the database.

In operation 530, the electronic device may execute a function corresponding to the gesture of the user based on the database. The electronic device may obtain information about a function mapped to the gesture of the user from the database. The electronic device may execute the corresponding function by using the obtained information.

Figure 6:
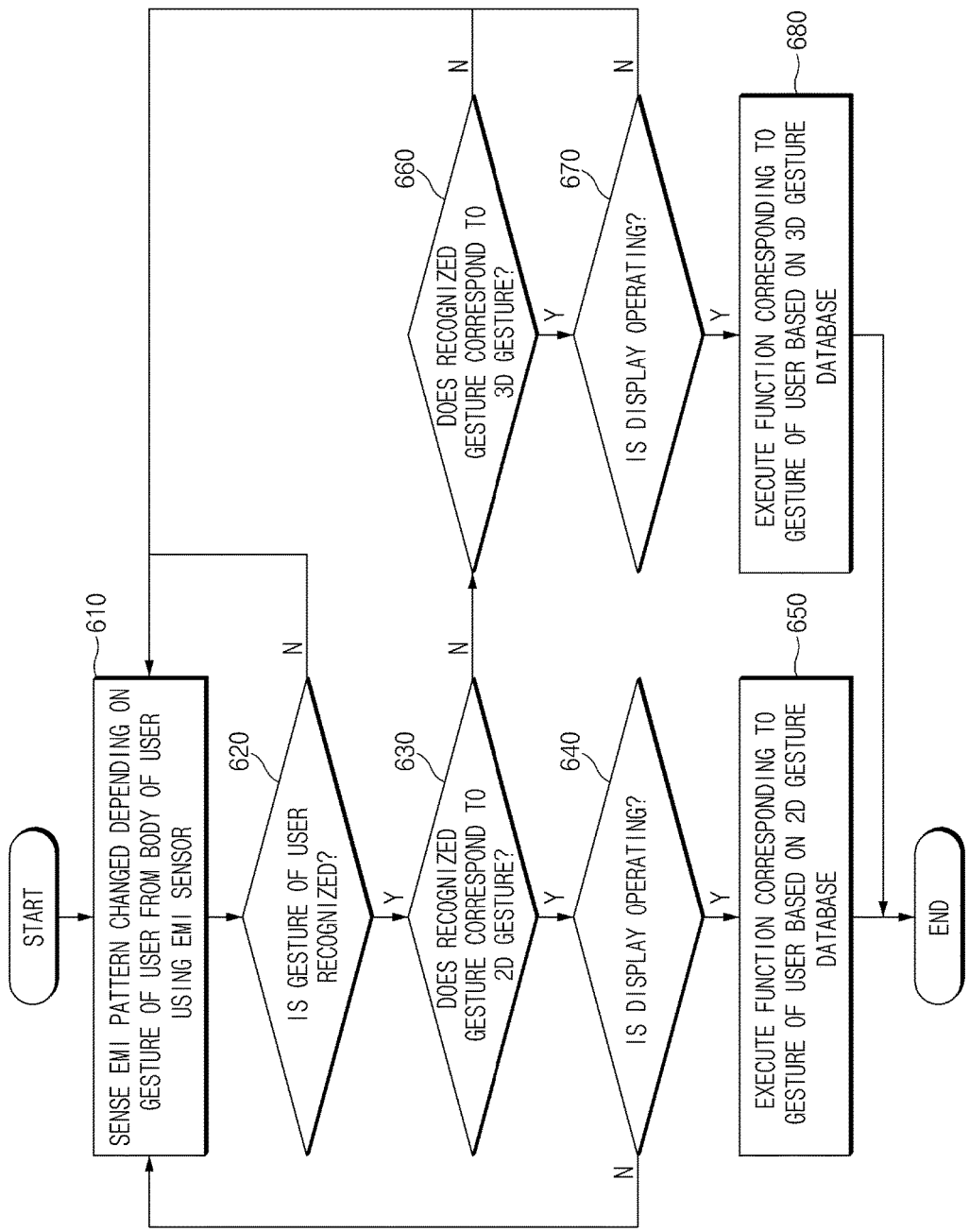
FIG. 6 is a flowchart for describing a control method based on an EMI pattern of an electronic device, according to an embodiment of the present disclosure.

FIG. 6 is a flowchart for describing a control method based on an EMI pattern of an electronic device, according to an embodiment of the present disclosure.

Hereinafter, it is assumed that the electronic device 400 of FIG. 4 performs a process of FIG. 6. In addition, as described in FIG. 6, it is understood that the operation described as being executed by an electronic device is controlled by the processor 450 of the electronic device 400. For convenience of description, a detailed description about operations described with reference to FIG. 5 will not be repeated here.

Referring to FIG. 6, in operation 610, the electronic device may sense an EMI pattern, which is changed according to a gesture of a user, from the body of the user by using an EMI sensor.

In operation 620, the electronic device may determine whether the gesture of the user is recognized. For example, if a change in the EMI pattern is sensed due to movement of the user, the electronic device may determine that the gesture of the user is recognized. Since operation 620 is an optional element, operation 620 may be skipped according to implementation of the present disclosure.

If the gesture is recognized, in operation 630, the electronic device may determine whether the recognized gesture corresponds to a 2D gesture. For example, the electronic device may determine whether the gesture of the user corresponds to the 2D gesture, based on a database (e.g., a first database) associated with the 2D gesture. The electronic device may compare an EMI pattern changed by movement of the user with an EMI pattern stored in the first database. If the stored EMI pattern that is the same as (or similar to) the sensed EMI pattern is found, the electronic device may obtain information about the gesture of the user corresponding to the stored EMI pattern from the first database. In the case where the information about the gesture is obtained from the first database, the recognized gesture may correspond to the 2D gesture.

In the case where the recognized gesture corresponds to the 2D gesture, in operation 640, the electronic device may determine whether a display included in the electronic device is operating. For example, the electronic device may determine whether a screen is being output to the display.

In the case where the display is operating, in operation 650, the electronic device may execute a function corresponding to the gesture of the user based on a 2D gesture database. For example, the electronic device may obtain information about a function mapped to the gesture of the user from the first database. The electronic device may execute the corresponding function by using the obtained information.

In the case where the recognized gesture does not correspond to the 2D gesture, in operation 660, the electronic device may determine whether the recognized gesture corresponds to a 3D gesture. For example, the electronic device may determine whether the gesture of the user corresponds to the 3D gesture, based on a database (e.g., a second database) associated with the 3D gesture. The electronic device may compare an EMI pattern changed by movement of the user with an EMI pattern stored in the second database. If the stored EMI pattern that is the same as (or similar to) the sensed EMI pattern is found, the electronic device may obtain information about the gesture of the user corresponding to the stored EMI pattern from the second database. In the case where the information about the gesture is obtained from the second database, the recognized gesture may correspond to the 3D gesture.

In the case where the recognized gesture corresponds to the 3D gesture, in operation 670, the electronic device may determine whether a display included in the electronic device is operating.

In the case where the display is operating, in operation 680, the electronic device may execute a function corresponding to the gesture of the user based on a 3D gesture database. For example, the electronic device may obtain information about a function mapped to the gesture of the user from the second database. The electronic device may execute the corresponding function by using the obtained information.

In the case where the display does not operate or in the case where the 2D gesture or the 3D gesture is not recognized, the electronic device may perform operation 610 again.

Figure 7:
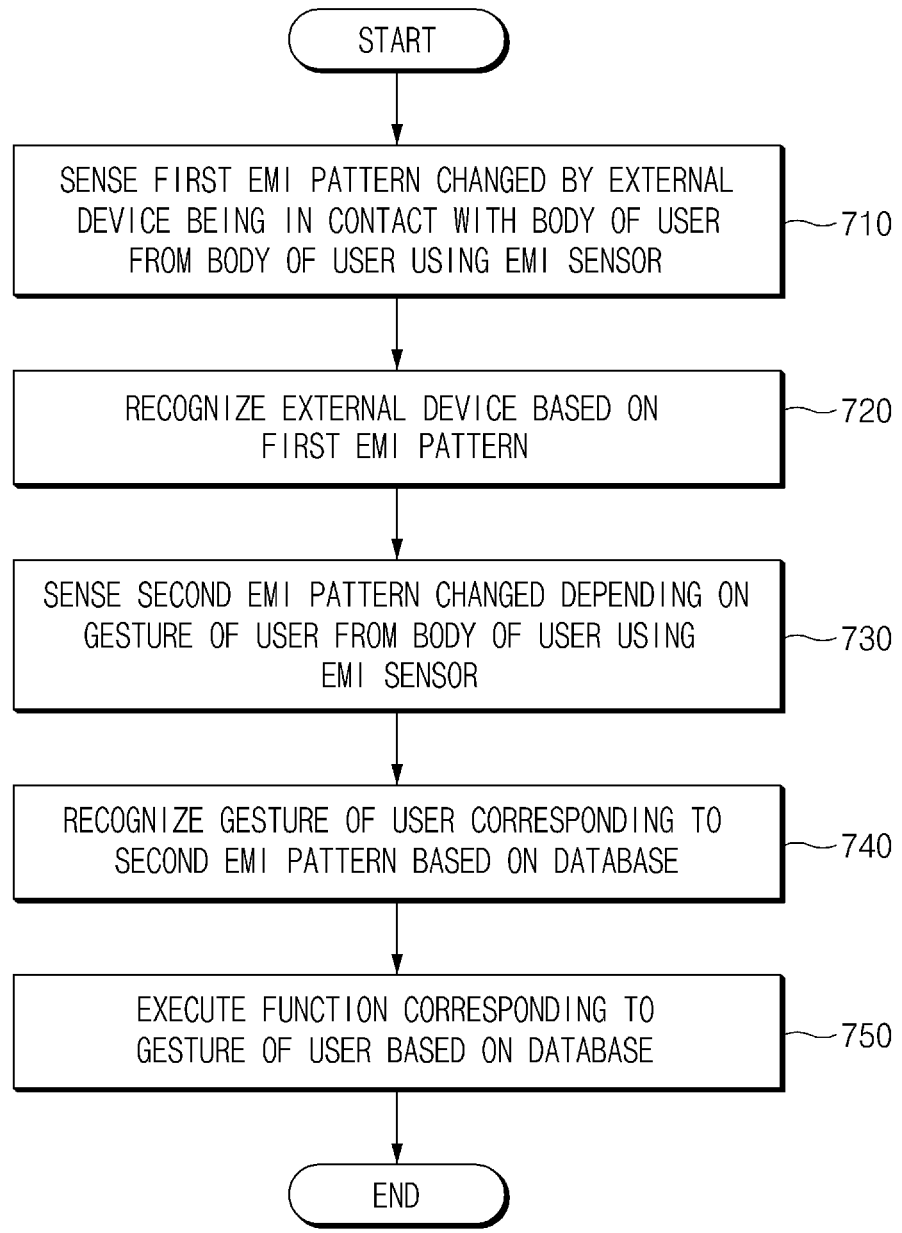
FIG. 7 is a flowchart for describing a control method based on an EMI pattern of an electronic device, according to an embodiment of the present disclosure.

FIG. 7 is a flowchart for describing a control method based on an EMI pattern of an electronic device, according to an embodiment of the present disclosure.

Hereinafter, it is assumed that the electronic device 400 of FIG. 4 performs a process of FIG. 7. In addition, as described in FIG. 7, it is understood that the operation described as being executed by the electronic device is controlled by the processor 450 of the electronic device 400. For descriptive convenience, a description of an operation given with reference to FIGS. 5 and 6 will not be repeated here.

Referring to FIG. 7, in operation 710, the electronic device may sense a first EMI pattern, which is changed by an external device being in contact with the body of the user, from the body of the user by using an EMI sensor. For example, in the case where the external device is in contact with the body of the user, the EMI pattern sensed from the body of the user may be changed. For another example, in the case where the body of the user is in contact with an object (e.g., a table) being in contact with the external device (e.g., a speaker), the EMI pattern sensed from the body of the user may be changed. In the present disclosure, the fact that the body of the user is in contact with the external device may include the case where the body of the user is in contact with an object being in contact with the external device. The electronic device may sense the change in the EMI pattern from the body of the user by using the EMI sensor being in contact with (or adjacent to) the body of the user.

In operation 720, the electronic device may recognize the external device based on the first EMI pattern. For example, the electronic device may compare the first EMI pattern with an EMI pattern stored in a database. If the stored EMI pattern that is the same as (or similar to) the first EMI pattern is found, the electronic device may obtain information about the external device corresponding to the stored EMI pattern from the database.

In operation 730, the electronic device may sense a second EMI pattern, which is changed according to the gesture of the user, from the body of the user by using an EMI sensor.

In operation 740, the electronic device may recognize the gesture of the user corresponding to the second EMI pattern based on the database.

In operation 750, the electronic device may execute a function corresponding to the gesture of the user based on the database.

Figure 8:
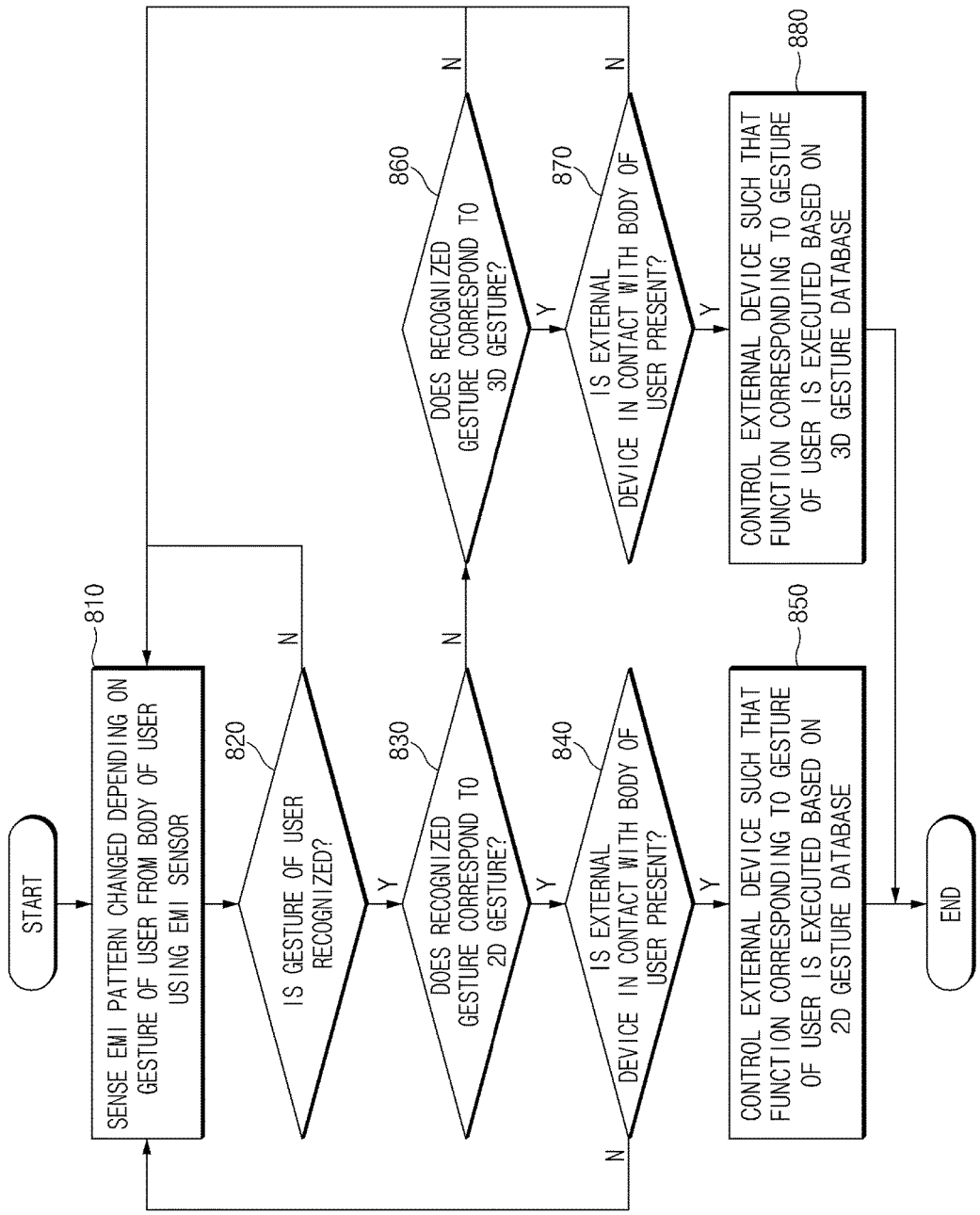
FIG. 8 is a flowchart for describing a control method based on an EMI pattern of an electronic device, according to an embodiment of the present disclosure.

FIG. 8 is a flowchart for describing a control method based on an EMI pattern of an electronic device, according to an embodiment of the present disclosure.

Hereinafter, it is assumed that the electronic device 400 of FIG. 4 performs a process of FIG. 8. In addition, as described in FIG. 8, it is understood that the operation described as being executed by the electronic device is controlled by the processor 450 of the electronic device 400. For convenience of description, a description duplicated with an operation described with reference to FIGS. 5 to 7 will not be repeated here.

Referring to FIG. 8, in operation 810, the electronic device may sense an EMI pattern, which is changed according to a gesture of a user, from the body of the user by using an EMI sensor.

In operation 820, the electronic device may determine whether the gesture of the user is recognized.

If the gesture is recognized, in operation 830, the electronic device may determine whether the recognized gesture corresponds to a 2D gesture.

In the case where the recognized gesture corresponds to the 2D gesture, in operation 840, the electronic device may determine whether an external device being in contact with the body of the user is present. For example, the electronic device may sense the EMI pattern by using the EMI sensor and may obtain information about the external device corresponding to the sensed EMI pattern from a database. If the information about the external device is obtained, the electronic device may determine that the external device being in contact with the body of the user is present.

In the case where the external device being in contact with the body of the user is present, in operation 850, the electronic device may execute a function corresponding to the gesture of the user based on a 2D gesture database.

In the case where the recognized gesture does not correspond to the 2D gesture, in operation 860, the electronic device may determine whether the recognized gesture corresponds to a 3D gesture.

In the case where the recognized gesture corresponds to the 3D gesture, in operation 870, the electronic device may determine whether an external device being in contact with the body of the user is present.

In the case where the external device being in contact with the body of the user is present, in operation 880, the electronic device may execute a function corresponding to the gesture of the user based on a 3D gesture database.

In the case where there is no external device being in contact with the body of the user, or in the case where the 2D gesture or the 3D gesture is not recognized, the electronic device may perform operation 810 again.

Figure 9:
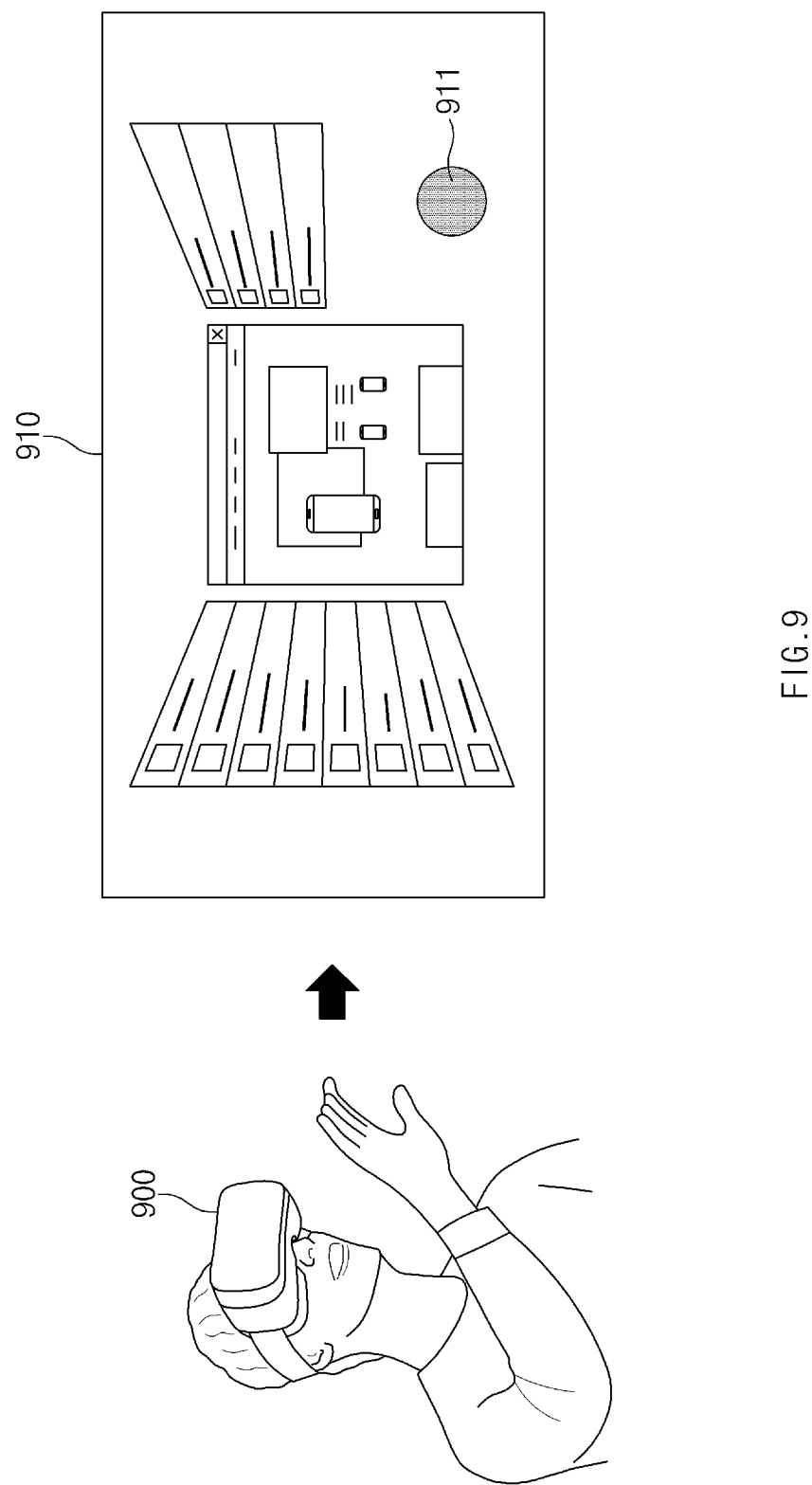
FIG. 9 is a view for describing an operation of the electronic device, according to an embodiment of the present disclosure.

FIG. 9 is a view for describing an operation of the electronic device, according to an embodiment of the present disclosure.

Referring to FIG. 9, an electronic device 900 according to an embodiment may be a head-mounted device or a mobile device coupled to the head-mounted device. The electronic device 900 may output a screen 910 in a display. The electronic device 900 may include an EMI sensor disposed at a location where the head of the user is contacted in the case where the electronic device 900 is worn on a head of a user.

According to an embodiment, the electronic device 900 (e.g., the processor 450) may sense an EMI pattern from the body of the user and may control a screen, which is displayed in the display, based on the sensed EMI pattern.

For example, the electronic device 900 may display a pointer 911 indicating a location, to which the user applies an input, in the display. The electronic device 900 may control the pointer 911 based on the sensed EMI pattern. For example, the electronic device 900 may move the pointer 911 such that the pointer 911 corresponds to movement of a hand of the user. For example, in the case where the hand of the user moves to right, the electronic device 900 may recognize that the hand of the user moves to right, based on the EMI pattern. The electronic device 900 may move the pointer 911 in the right direction in the screen 910 such that the pointer 911 corresponds to the movement of the hand of the user.

According to an embodiment, the electronic device 900 may apply a virtual input to a location, at which the pointer 911 is displayed, based on the sensed EMI pattern. For example, in the case of "move forward and returns", the electronic device 900 may recognize "move forward and return" based on the EMI pattern. The electronic device 900 may recognize that an input is applied to a location, at which the pointer 911 is displayed, in response to the movement of the hand of the user. For another example, in the case of "from grasp to spread", the electronic device 900 may recognize "from grasp to spread" based on the EMI pattern. The electronic device 900 may enlarge the screen 910 such that the size of the screen 910 corresponds to the movement of the hand of the user.

According to an embodiment, the electronic device 900 may display a graphic element, which corresponds to the gesture of the user in the screen 910, such as an icon, an effect, or the like. For example, the electronic device 900 may output animation corresponding to the gesture of the user in the screen 910. For another example, in the case where both hands of the user move, the electronic device 900 may display two pointers in the screen 910.

Figure 10:
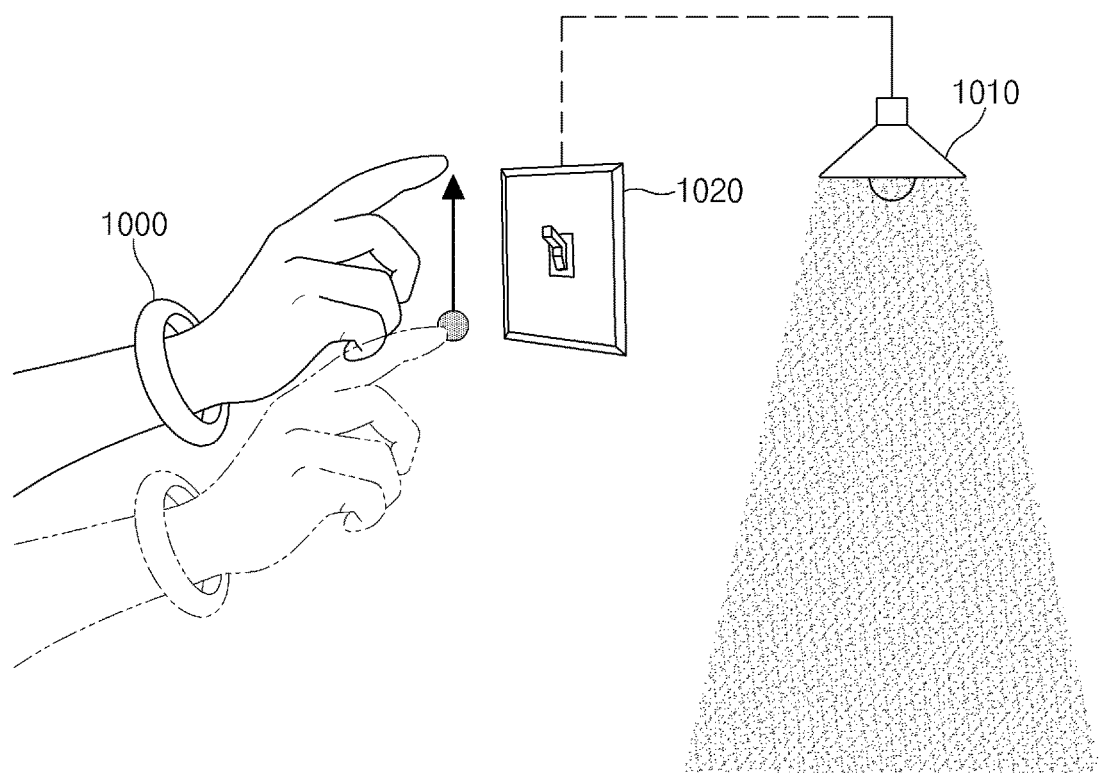
FIG. 10 is a view for describing an operation of the electronic device, according to an embodiment of the present disclosure.

FIG. 10 is a view for describing an operation of the electronic device, according to an embodiment of the present disclosure.

Referring to FIG. 10, an electronic device 1000 according to an embodiment may be a wearable device, which is capable of being worn on a wrist of a user, such as a smart watch, a smart band, or the like. In the case where the electronic device 1000 is worn on the wrist of the user, the electronic device 1000 may include an EMI sensor disposed at a location where the wrist of the user is contacted.

According to an embodiment, the electronic device 1000 (e.g., the processor 450) may operate in conjunction with an LED bulb 1010. A finger of the user of electronic device 1000 may be in contact with a switch 1020 connected with the LED bulb 1010. Alternatively, the finger of the user of electronic device 1000 may be in contact with a wall adjacent to the switch 1020. An EMI pattern sensed from the body of the user may be changed by the LED bulb 1010 and/or a wire connecting the LED bulb 1010 and the switch 1020. The electronic device 1000 may sense the EMI pattern from the body of the user and may recognize the LED bulb 1010 by using the sensed EMI pattern.

For example, in the case where the finger of the user swipes to up, the electronic device 1000 may recognize that the finger of the user swipes to up, based on the EMI pattern sensed from the wrist of the user. The electronic device 1000 may verify a function (e.g., an increase in brightness) corresponding to the recognized external device and the gesture of the user. After the electronic device 1000 operates in conjunction with the LED bulb 1010, in the case where the finger of the user swipes to up, the electronic device 1000 may control the LED bulb 1010 such that brightness of the LED bulb 1010 increases in response to the gesture of the user. For another example, after the electronic device 1000 operates in conjunction with the LED bulb 1010, in the case where the finger of the user swipes to down, the electronic device 1000 may control the LED bulb 1010 such that brightness of the LED bulb 1010 decreases.

Figure 11:
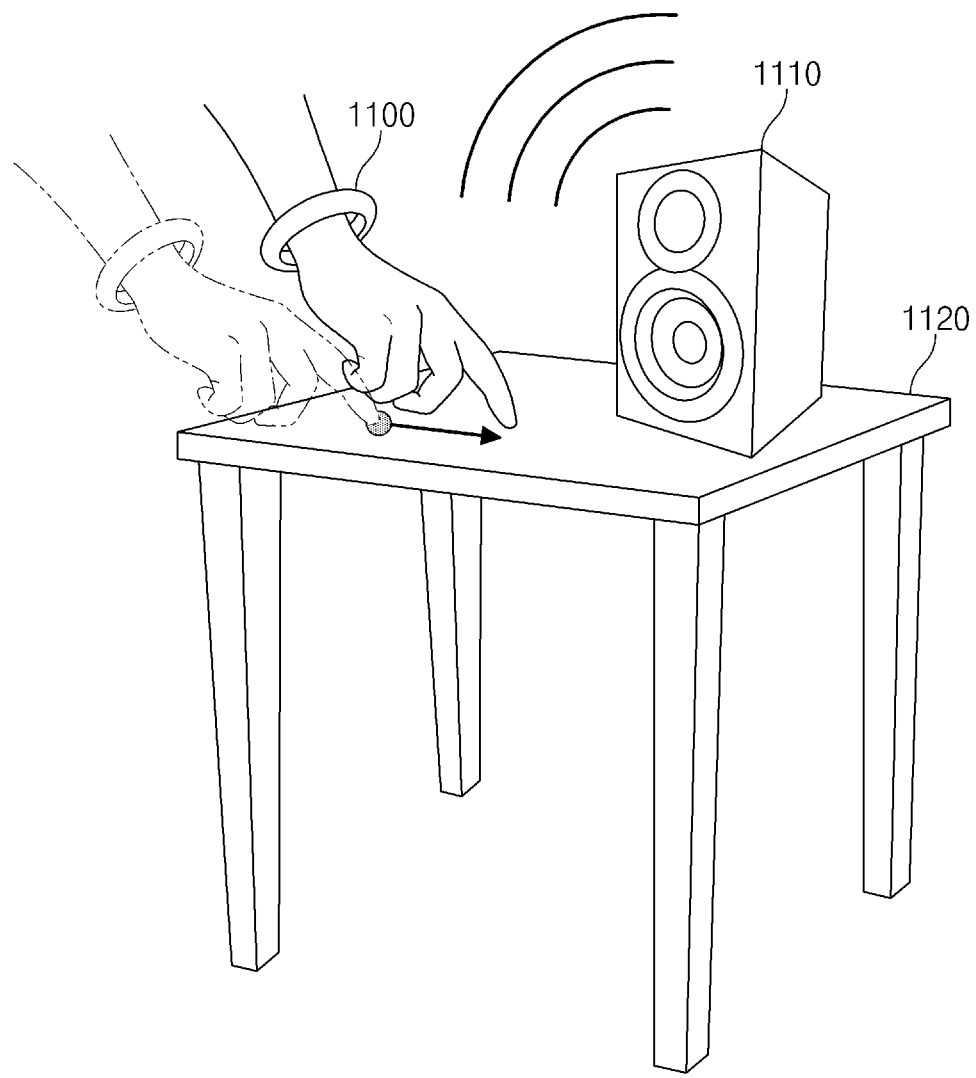
FIG. 11 is a view for describing an operation of the electronic device, according to an embodiment of the present disclosure.

FIG. 11 is a view for describing an operation of the electronic device, according to an embodiment of the present disclosure.

Referring to FIG. 11, an electronic device 1100 according to an embodiment may be a wearable device, which is capable of being worn on a wrist of a user, such as a smart watch, a smart band, or the like. In the case where the electronic device 1100 is worn on the wrist of the user, the electronic device 1100 may include an EMI sensor disposed at a location where the wrist of the user is contacted.

According to an embodiment, the electronic device 1100 (e.g., the processor 450) may operate in conjunction with a speaker 1110. A finger of the user of the electronic device 1100 may be in contact with a table 1120 on which the speaker 1110 is placed. An EMI pattern generated by the speaker 1110 may be transmitted to the finger of the user through the table 1120. The electronic device 1100 may sense the EMI pattern from the body of the user and may recognize the speaker 1110 by using the sensed EMI pattern.

For example, in the case where the finger of the user swipes to right on the table 1120, the electronic device 1100 may recognize that the finger of the user swipes to right, based on the EMI pattern sensed from the wrist of the user. In this case, since the finger of the user moves on a plane, the electronic device 1100 may recognize that the finger of the user swipes to right, based on a 2D gesture database.

The electronic device 1100 may verify a function (e.g., an increase in volume) corresponding to the recognized external device and the gesture of the user. The electronic device 1100 may verify a function corresponding to the gesture of the user based on the 2D gesture database. For example, the electronic device 1100 may control the speaker 1110 such that the volume of the speaker 1110 increases in response to the gesture of the user. For another example, in the case where the finger of the user swipes to left, the electronic device 1100 may control the speaker 1110 such that the volume of the speaker 1110 decreases.

Figure 12:
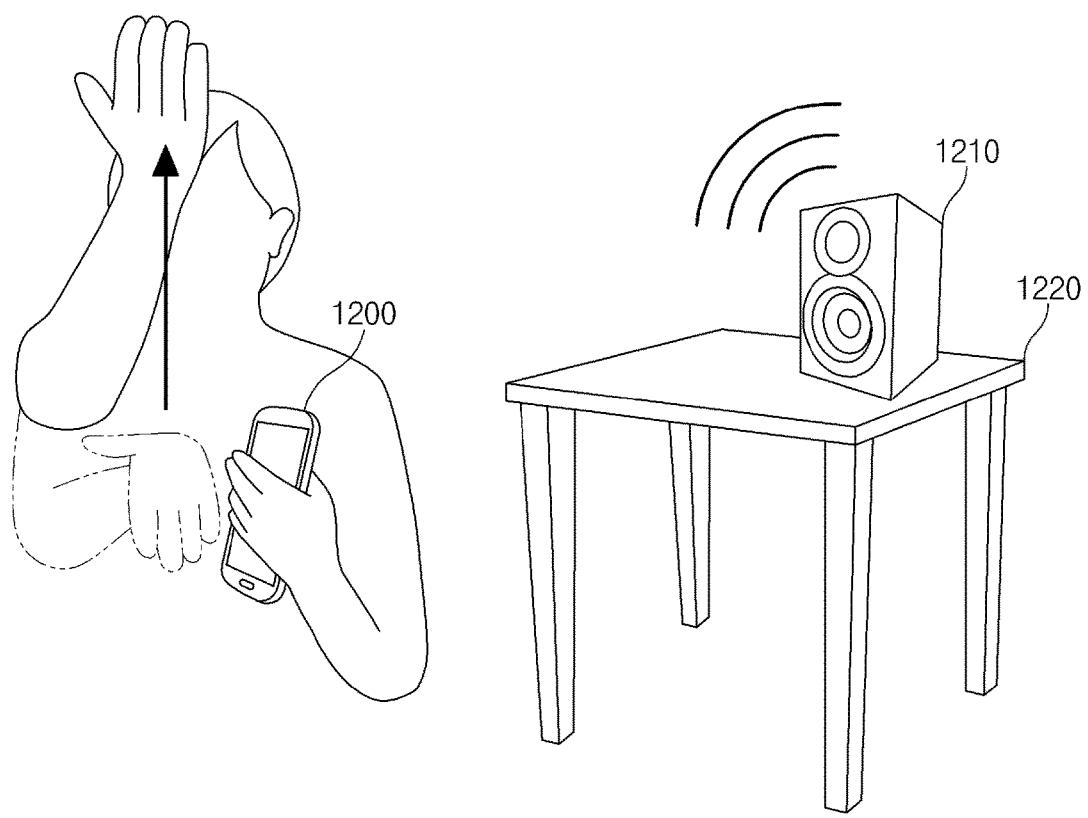
FIG. 12 is a view for describing an operation of the electronic device, according to an embodiment of the present disclosure.

FIG. 12 is a view for describing an operation of the electronic device, according to an embodiment according to the present disclosure.

Referring to FIG. 12, an electronic device 1200 according to an embodiment may be a mobile device such as a smartphone or the like. An EMI sensor included in the electronic device 1200 may be in contact with a hand of a user.

According to an embodiment, the electronic device 1200 (e.g., the processor 450) may operate in conjunction with a speaker 1210. A part of the body of the user of the electronic device 1200 may be in contact with the speaker 1210 or a table 1220 on which the speaker 1210 is placed. An EMI pattern generated by the speaker 1210 may be transmitted to the finger of the user through the table 1220. The electronic device 1200 may sense the EMI pattern from the body of the user and may recognize the speaker 1210 by using the sensed EMI pattern. In the case where the speaker 1210 is recognized, the body of the user may be detached from the speaker 1210 or the table 1220.

For example, in the case where the hand of the user moves upwards, the electronic device 1200 may recognize that the hand of the user moves upwards, based on the EMI pattern sensed from the wrist of the user. In this case, since the hand of the user moves in a three-dimensional space, the electronic device 1200 may recognize that the hand of the user moves upwards, based on a 3D gesture database.

The electronic device 1200 may verify a function (e.g., an increase in volume) corresponding to the recognized external device and the gesture of the user. The electronic device 1200 may verify a function corresponding to the gesture of the user based on the 3D gesture database. For example, the electronic device 1200 may control the speaker 1210 such that the volume of the speaker 1210 increases in response to the gesture of the user. For another example, in the case where the finger of the user moves downwards, the electronic device 1200 may control the speaker 1210 such that the volume of the speaker 1210 decreases.

Figure 13:
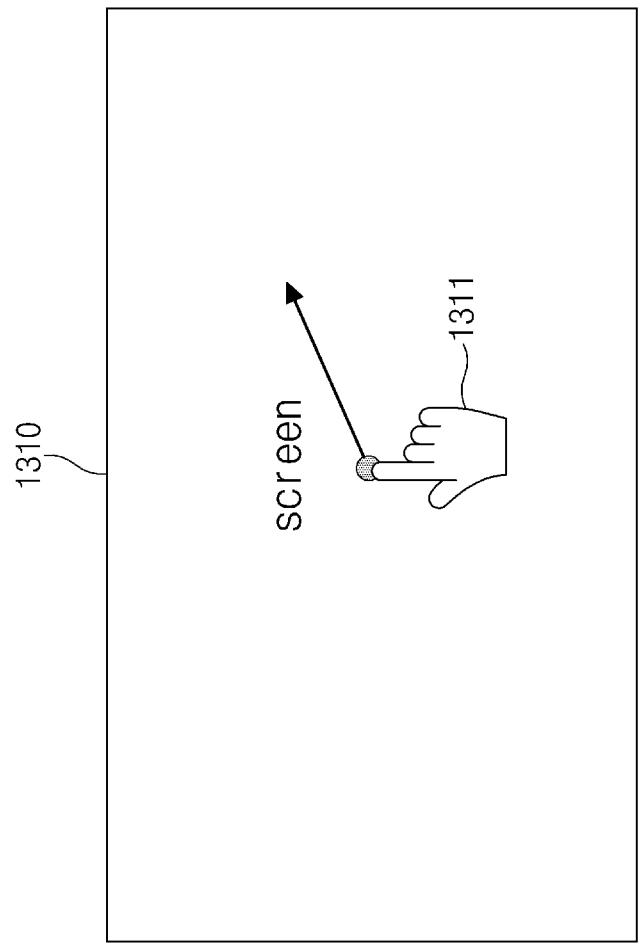
FIG. 13 is a view for describing an operation of the electronic device, according to an embodiment of the present disclosure.
Figure 13:
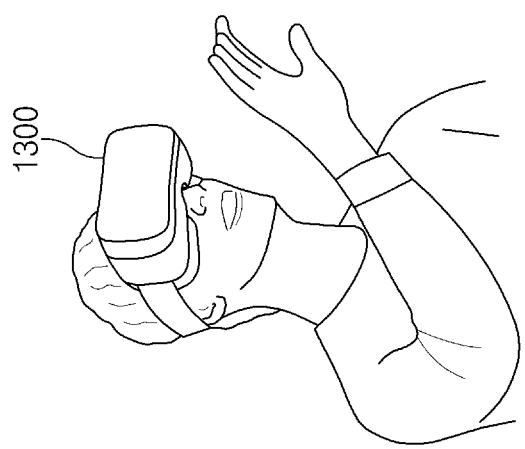

FIG. 13 is a view for describing an operation of the electronic device, according to an embodiment according to the present disclosure.

Referring to FIG. 13, an electronic device 1300 according to an embodiment may be a head-mounted device or a mobile device coupled to the head-mounted device. The electronic device 1300 may output a screen 1310 in a display. In the case where the electronic device 1300 is worn on a head of a user, the electronic device 900 may include an EMI sensor disposed at a location where the head of the user is contacted.

According to an embodiment, if an EMI pattern changed according to a gesture of the user is sensed, the electronic device 1300 may display a pointer 1311 indicating a location, to which the user applies an input, at a specified location of a display. For example, if the gesture of the user is recognized, the electronic device 1300 may display the pointer 1311 at the center point of a screen 1310. If a hand of the user moves to the upper left of the screen 1310, the electronic device 1300 may recognize that the hand of the user moves to upper left, based on the EMI pattern and may move the pointer 1311 in a direction in which the hand of the user moves.

Figure 14:
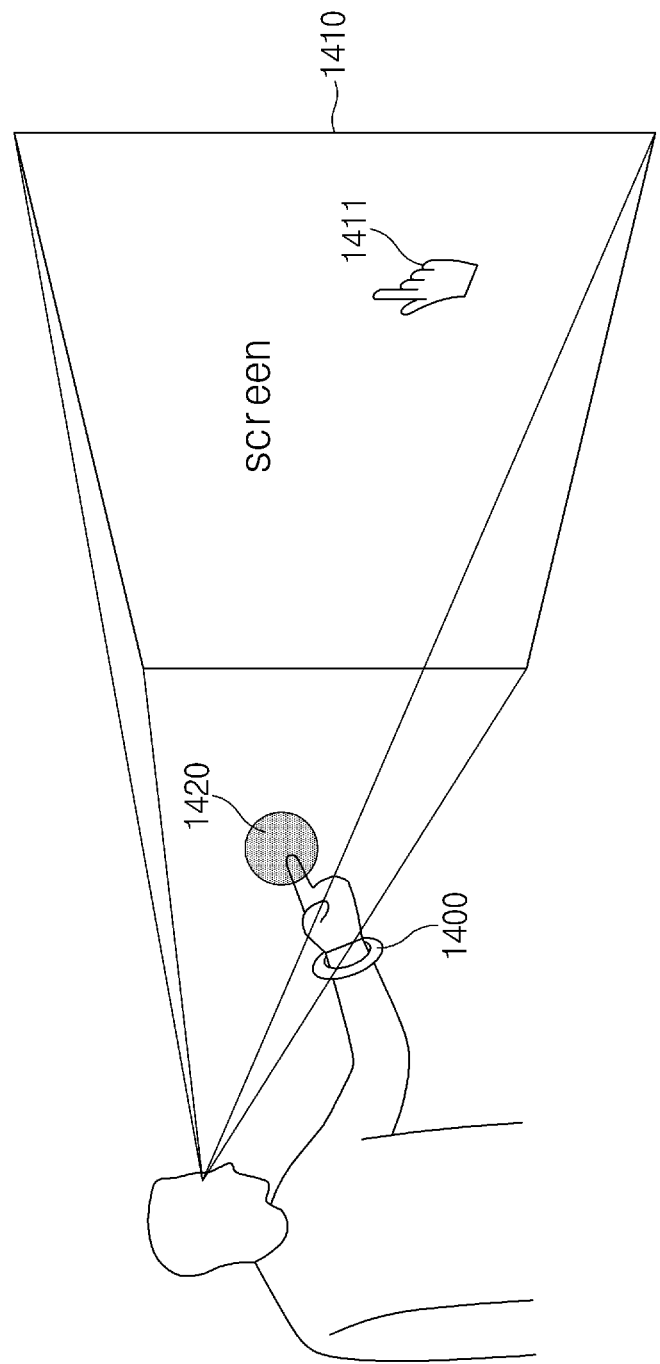
FIG. 14 is a view for describing an operation of the electronic device, according to an embodiment of the present disclosure.

FIG. 14 is a view for describing an operation of the electronic device, according to an embodiment according to the present disclosure.

Referring to FIG. 14, an electronic device 1400 according to an embodiment may be a wearable device, which is capable of being worn on a wrist of a user, such as a smart watch, a smart band, or the like. In the case where the electronic device 1400 is worn on the wrist of the user, the electronic device 1000 may include an EMI sensor disposed at a location where the wrist of the user is contacted. The electronic device 1400 may recognize a location of the user with respect to an external device. For example, the external device may irradiate an EMI pattern. The body of the user may act as an antenna. Due to the EMI pattern of the external device, the EMI pattern sensed from the body of the user may be differently changed according to the location of the body of the user with respect to the external device. The electronic device 1400 may recognize the location of the body of the user with respect to the external device based on the EMI pattern sensed from the body of the user.

According to an embodiment, if an EMI pattern changed according to a gesture of the user is sensed, the electronic device 1400 may display a pointer 1411 indicating a location, to which the user applies an input, at a location corresponding to a location 1420 where the gesture of the user of a display is generated. For example, the electronic device 1400 may operate in conjunction with an external device that is capable of outputting a screen 1410. In the case where the user is in contact with the external device or a remote controller that controls the external device, the electronic device 1400 may recognize the external device by using the EMI pattern sensed from the wrist of the user. The electronic device 1400 may recognize that the finger of the user moves at the location 1420. The electronic device 1400 may display the pointer 1411 at a location on the screen 1410, which corresponds to the location 1420 in gaze of the user.

Figure 15:
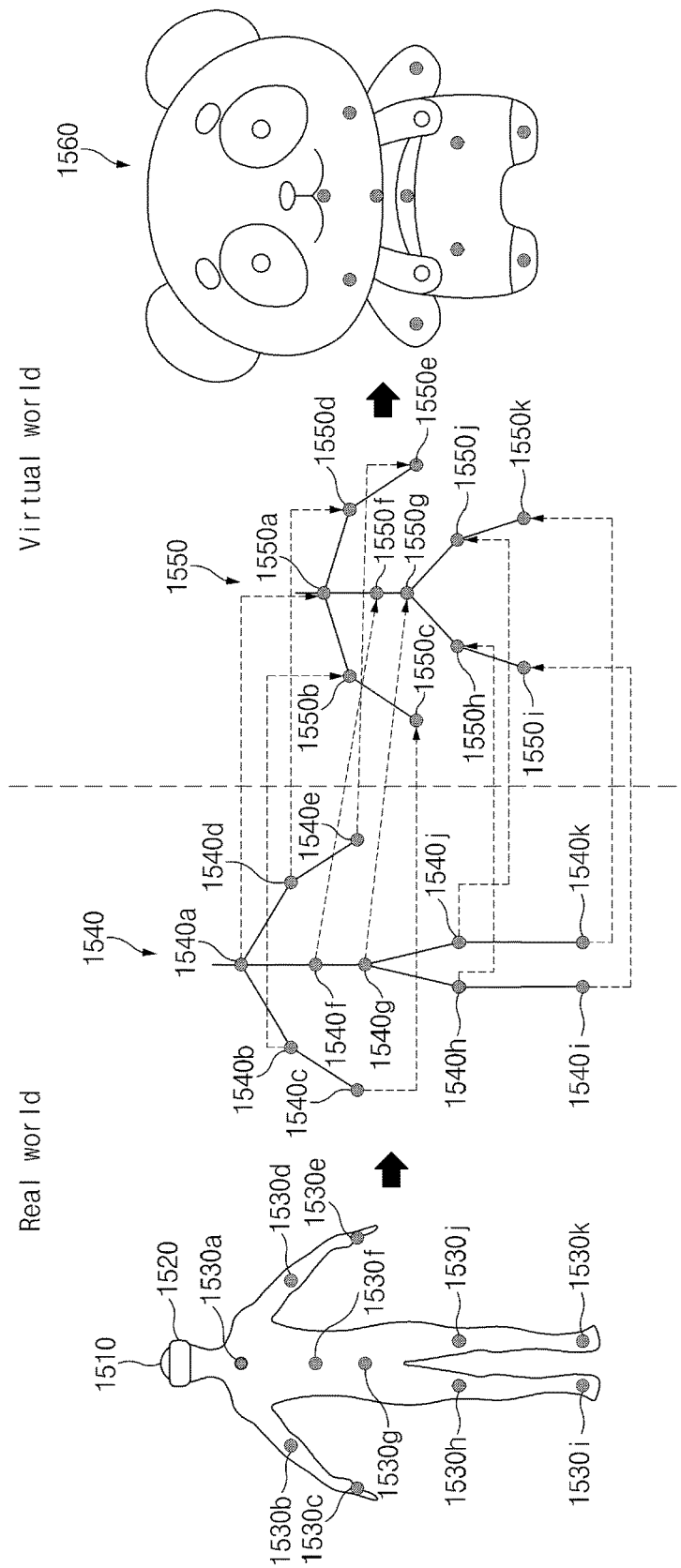
FIG. 15 is a view for describing an operation of the electronic device, according to an embodiment of the present disclosure.

FIG. 15 is a view for describing an operation of the electronic device, according to an embodiment according to the present disclosure.

Referring to FIG. 15, an electronic device 1520 may be worn on a head of a user 1510. If the electronic device 1520 is worn on the head of the user 1510, an EMI sensor (not illustrated) included in the electronic device 1520 may be in contact with a body of the user 1510. The electronic device 1520 may sense an EMI pattern from the body of the user 1510 by using an EMI sensor. The electronic device 1520 may recognize the movement of each of a plurality of points 1530$a$ to 1530$k$ of the body of the user 1510 based on a change in the EMI pattern.

The electronic device 1520 may apply the movement of each of the plurality of points 1530$a$ to 1530$k$ to a 3D skeleton 1540 corresponding to the user 1510. A plurality of points 1540$a$ to 1540$k$ of the 3D skeleton 1540 may correspond to the plurality of points 1530$a$ to 1530$k$ of the body of the user 1510, respectively.

The electronic device 1520 may apply the movement of the 3D skeleton 1540 corresponding to the user 1510 to a 3D skeleton 1550 corresponding to an avatar 1560 of the user 1510. A plurality of points 1550$a$ to 1550$k$ of a 3D skeleton 1550 corresponding to the avatar 1560 may correspond to the plurality of points 1540$a$ to 1540$k$ of the 3D skeleton 1540 corresponding to the user 1510.

The electronic device 1520 may move the avatar 1560 of the user 1510 such that the movement of the avatar 1560 of the user 1510 corresponds to the movement of the user 1510. As described above, the electronic device 1520 may precisely recognize the movement the entire body of user 1510 by using the EMI pattern.

The term "module" used herein may include a unit, which is implemented with hardware, software, or firmware, and may be interchangeably used with the terms "logic", "logical block", "component", "circuit", or the like. The "module" may be a minimum unit of an integrated component or a part thereof or may be a minimum unit for performing one or more functions or a part thereof. The "module" may be implemented mechanically or electronically and may include, for example, an application-specific IC (ASIC) chip, a field-programmable gate array (FPGA), and a programmable-logic device for performing some operations, which are known or will be developed. According to various embodiments, at least a part of an apparatus (e.g., modules or functions thereof) or a method (e.g., operations) may be, for example, implemented by instructions stored in a computer-readable storage media (e.g., the memory 130) in the form of a program module. The instruction, when executed by a processor (e.g., a processor 120), may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The instruction may include codes created by a compiler or codes that are capable of being executed by a computer by using an interpreter. According to various embodiments, a module or a program module may include at least one of the above elements, or a part of the above elements may be omitted, or other elements may be further included. According to various embodiments, operations executed by modules, program modules, or other elements may be executed by a successive method, a parallel method, a repeated method, or a heuristic method, or at least one part of operations may be executed in different sequences or omitted. Alternatively, other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
an electromagnetic interference (EMI) sensor configured to sense EMI patterns from an outside of the electronic device and disposed at a location touchable by a body of a user of the electronic device;
a memory configured to store one or more databases associated with at least a part of the EMI patterns, gestures of the user, and functions executable by the electronic device; and
at least one processor electrically connected with the EMI sensor and the memory,
wherein the at least one processor is configured to:
sense an EMI pattern, which is changed according to a gesture among the gestures of the user, from among the EMI patterns of the body of the user using the EMI sensor, and
execute a function, which corresponds to the sensed EMI pattern based on at least a part of the one or more databases, from among the functions,
wherein the memory is configured to store a first database including information associated with a two dimensional gesture of the user which is recognized in a touch panel and a second database including information associated with a three dimensional gesture of the user which moves in a three dimensional space, and
wherein the at least one processor is further configured to:
preferentially determine whether the gesture of the user corresponds to the two dimensional gesture,
recognize the gesture of the user by using the first database if the gesture of the user corresponds to the two dimensional gesture, and
recognize the gesture of the user by using the second database if the gesture of the user is not recognized based on the first database.

2. The electronic device of claim 1, wherein the at least one processor is further configured to:
recognize the gesture of the user corresponding to the sensed EMI pattern based on the at least part of the one or more databases, and
execute the function corresponding to the gesture of the user based on the at least part of the one or more databases.

3. The electronic device of claim 1, further comprising:
a display electrically connected with the at least one processor,
wherein the at least one processor is further configured to:
control a screen displayed on the display based on the sensed EMI pattern.

4. The electronic device of claim 1, further comprising:
a display electrically connected with the at least one processor,
wherein the at least one processor is further configured to:
display a pointer on the display, and
control the pointer based on the sensed EMI pattern.

5. The electronic device of claim 4, wherein the at least one processor is further configured to:
apply a virtual input to a location at which the pointer is displayed, based on the sensed EMI pattern.

6. The electronic device of claim 1, further comprising:
a communication circuit configured to communicate with an external device,
wherein the at least one processor is further configured to:
execute the function corresponding to the sensed EMI pattern based on a database stored in the external device.

7. The electronic device of claim 1,
wherein the electronic device is a wearable device, and
wherein, if the wearable device is worn on the user, the EMI sensor is disposed at the location touchable by the body of the user.

8. The electronic device of claim 1, further comprising:
a display electrically connected with the at least one processor,
wherein the at least one processor is further configured to:
display, if the EMI pattern changed according to the gesture of the user is sensed, a pointer at a specified location of the display, and
move the pointer based on the sensed EMI pattern.

9. The electronic device of claim 1, further comprising:
a display electrically connected with the at least one processor,
wherein the at least one processor is further configured to:
display, if the EMI pattern changed according to the gesture of the user is sensed, a pointer at a location of the display corresponding to a location where the gesture of the user is generated.

10. The electronic device of claim 1, wherein the electronic device comprises one of a head-mounted device or a smart glass.

11. The electronic device of claim 1, wherein the electronic device comprises a mobile device that is capable of being coupled to a head-mounted device.

12. An electronic device comprising:
a communication circuit configured to communicate with one or more external devices;
an electromagnetic interference (EMI) sensor configured to sense EMI patterns from an outside of the electronic device and disposed at a location touchable by a body of a user of the electronic device;
a memory configured to store one or more databases associated with at least a part of the EMI patterns, the one or more external devices, gestures of the user, and functions executable by the electronic device; and
at least one processor electrically connected with the communication circuit, the EMI sensor and the memory,
wherein the at least one processor is configured to:
sense a first EMI pattern changed by an external device, which is in contact with the body of the user, from among the one or more external devices of the body of the user using the EMI sensor,
recognize the contacted external device based on the first EMI pattern, sense a second EMI pattern, which is changed according to a gesture of the user, of the body of the user using the EMI sensor, and control the contacted external device such that a function, which corresponds to the second EMI pattern, from among the functions is executed based on at least a part of the one or more databases, wherein the memory is configured to store a first database including information associated with a two dimensional gesture of the user which is recognized in a touch panel and a second database including information associated with a three dimensional gesture of the user which moves in a three dimensional space, and wherein the at least one processor is further configured to:

preferentially determine whether the gesture of the user corresponds to the two dimensional gesture, recognize the gesture of the user by using the first database if the gesture of the user corresponds to the two dimensional gesture, and recognize the gesture of the user by using the second database if the gesture of the user is not recognized based on the first database.

13. The electronic device of claim 12, wherein the at least one processor is further configured to:

recognize the gesture of the user corresponding to the second EMI pattern based on the at least part of the one or more databases, and control the contacted external device such that the function corresponding to the gesture of the user is executed based on the at least part of the one or more databases.

14. The electronic device of claim 12, wherein the at least one processor is further configured to:

extract, if the contacted external device is recognized, data associated with the contacted external device from the one or more databases.

15. The electronic device of claim 12, wherein the electronic device operates in conjunction with the one or more external devices.

16. The electronic device of claim 12, wherein the electronic device comprises a smart watch.

* * * * *